(12) United States Patent
Atsumi et al.

(10) Patent No.: US 9,318,374 B2
(45) Date of Patent: Apr. 19, 2016

(54) SEMICONDUCTOR STORAGE DEVICE COMPRISING PERIPHERAL CIRCUIT, SHIELDING LAYER, AND MEMORY CELL ARRAY

(75) Inventors: Tomoaki Atsumi, Kanagawa (JP); Takashi Okuda, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 627 days.

(21) Appl. No.: 13/606,472

(22) Filed: Sep. 7, 2012

(65) Prior Publication Data

US 2013/0069132 A1    Mar. 21, 2013

(30) Foreign Application Priority Data

Sep. 21, 2011  (JP) ................................. 2011-205581
Oct. 13, 2011  (JP) ................................. 2011-225514

(51) Int. Cl.
| | | |
|---|---|---|
| *H01L 21/768* | (2006.01) | |
| *H01L 27/06* | (2006.01) | |
| *H01L 27/108* | (2006.01) | |

(Continued)

(52) U.S. Cl.
CPC .... *H01L 21/76801* (2013.01); *H01L 21/76826* (2013.01); *H01L 27/0688* (2013.01); *H01L 27/1085* (2013.01); *H01L 27/10805* (2013.01); *H01L 27/10873* (2013.01); *H01L 27/1225* (2013.01); *H01L 27/1156* (2013.01)

(58) Field of Classification Search
CPC ............ H01L 27/108; H01L 21/76801; H01L 27/1225; H01L 21/76826; H01L 27/0688

USPC ......................................................... 257/301
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,825,696 A * | 10/1998 | Hidaka et al. ............ | 365/189.09 |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

(Continued)

*Primary Examiner* — Evan Pert
*Assistant Examiner* — Damon Hillman
(74) *Attorney, Agent, or Firm* — Fish & Richardson P.C.

(57) ABSTRACT

Probability of malfunction of a semiconductor storage device is reduced. A shielding layer is provided between a memory cell array (e.g., a memory cell array including a transistor formed using an oxide semiconductor material) and a peripheral circuit (e.g., a peripheral circuit including a transistor formed using a semiconductor substrate), which are stacked. With this structure, the memory cell array and the peripheral circuit can be shielded from radiation noise generated between the memory cell array and the peripheral circuit. Thus, probability of malfunction of the semiconductor storage device can be reduced.

20 Claims, 13 Drawing Sheets

(51) Int. Cl.
*H01L 27/12* (2006.01)
*H01L 27/115* (2006.01)

(56) References Cited

U.S. PATENT DOCUMENTS

| | | | |
|---|---|---|---|
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,872,999 B2 * | 3/2005 | Uetake | 257/298 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,696,553 B2 * | 4/2010 | Nakamura et al. | 257/300 |
| 7,732,819 B2 | 6/2010 | Akimoto et al. | |
| 8,289,753 B2 | 10/2012 | Yamazaki et al. | |
| 8,395,938 B2 | 3/2013 | Yamazaki et al. | |
| 8,436,403 B2 | 5/2013 | Yamazaki et al. | |
| 8,455,868 B2 | 6/2013 | Yamazaki et al. | |
| 8,546,779 B2 * | 10/2013 | Sonehara | 257/2 |
| 8,654,582 B2 | 2/2014 | Yamazaki et al. | |
| 8,659,934 B2 | 2/2014 | Yamazaki et al. | |
| 8,811,067 B2 | 8/2014 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2010/0213525 A1 * | 8/2010 | Masuoka et al. | 257/306 |
| 2011/0089419 A1 | 4/2011 | Yamazaki et al. | |
| 2011/0101332 A1 | 5/2011 | Yamazaki et al. | |
| 2011/0127483 A1 * | 6/2011 | Sonehara | 257/2 |
| 2011/0187688 A1 | 8/2011 | Yamazaki et al. | |
| 2012/0001243 A1 | 1/2012 | Kato | |
| 2012/0063208 A1 * | 3/2012 | Koyama et al. | 365/149 |
| 2012/0182790 A1 | 7/2012 | Yamazaki et al. | |
| 2012/0188814 A1 | 7/2012 | Yamazaki et al. | |
| 2013/0256657 A1 | 10/2013 | Yamazaki et al. | |

FOREIGN PATENT DOCUMENTS

| | | |
|---|---|---|
| JP | 60-198861 A | 10/1985 |
| JP | 61-043463 A | 3/1986 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-176162 A | 6/1992 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-109084 A | 6/2011 |
| JP | 2011-119672 A | 6/2011 |
| JP | 2011-119713 A | 6/2011 |
| JP | 2011-151383 A | 8/2011 |
| JP | 2011-166131 A | 8/2011 |
| JP | 2011-175250 A | 9/2011 |
| JP | 2011-181912 A | 9/2011 |
| WO | 2004/114391 A1 | 12/2004 |
| WO | 2011/048968 A1 | 4/2011 |

(56) References Cited

FOREIGN PATENT DOCUMENTS

| WO | 2011/052351 A1 | 5/2011 |
|---|---|---|
| WO | WO-2011/055669 | 5/2011 |
| WO | WO-2011/077967 | 6/2011 |
| WO | WO-2011/086846 | 7/2011 |
| WO | WO-2011/093151 | 8/2011 |
| WO | WO-2011/096455 | 8/2011 |

OTHER PUBLICATIONS

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992, pp. 1006-1008.

Shoji Shukuri et al., "A Semi-Static Complementary Gain Cell Technology for Sub-1 V Supply DRAM's"; IEEE Transactions on Electron Devices; Jun. 1, 1994; pp. 926-931; vol. 41, No. 6.

Ohara, H et al., "Amorphous In—Ga—Zn—Oxide TFTs with Suppressed Variation for 4.0 inch QVGA AMOLED Display," 09 Digest of Technical Papers, Jul. 1, 2009, pp. 227-230, The Japan Society of Applied Physics.

Orita, M et al., "Amorphous transparent oxide InGaO3(ZnO)m (m<4): a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AMOLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

(56) References Cited

OTHER PUBLICATIONS

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YbFe2O4, and Yb2Fe3O7 Types of Structures for Compounds in the In2O3 and Sc2O3-A2O3-Bo Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.
Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMo3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," Nirim Newsletter, Mar. 1995, vol. 150, pp. 1-4 with English translation.
Nakamura, M et al., "The phase relations in the In2O3—Ga2ZnO4—ZnO system at 1350° C," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.
Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.
Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.
Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

\* cited by examiner

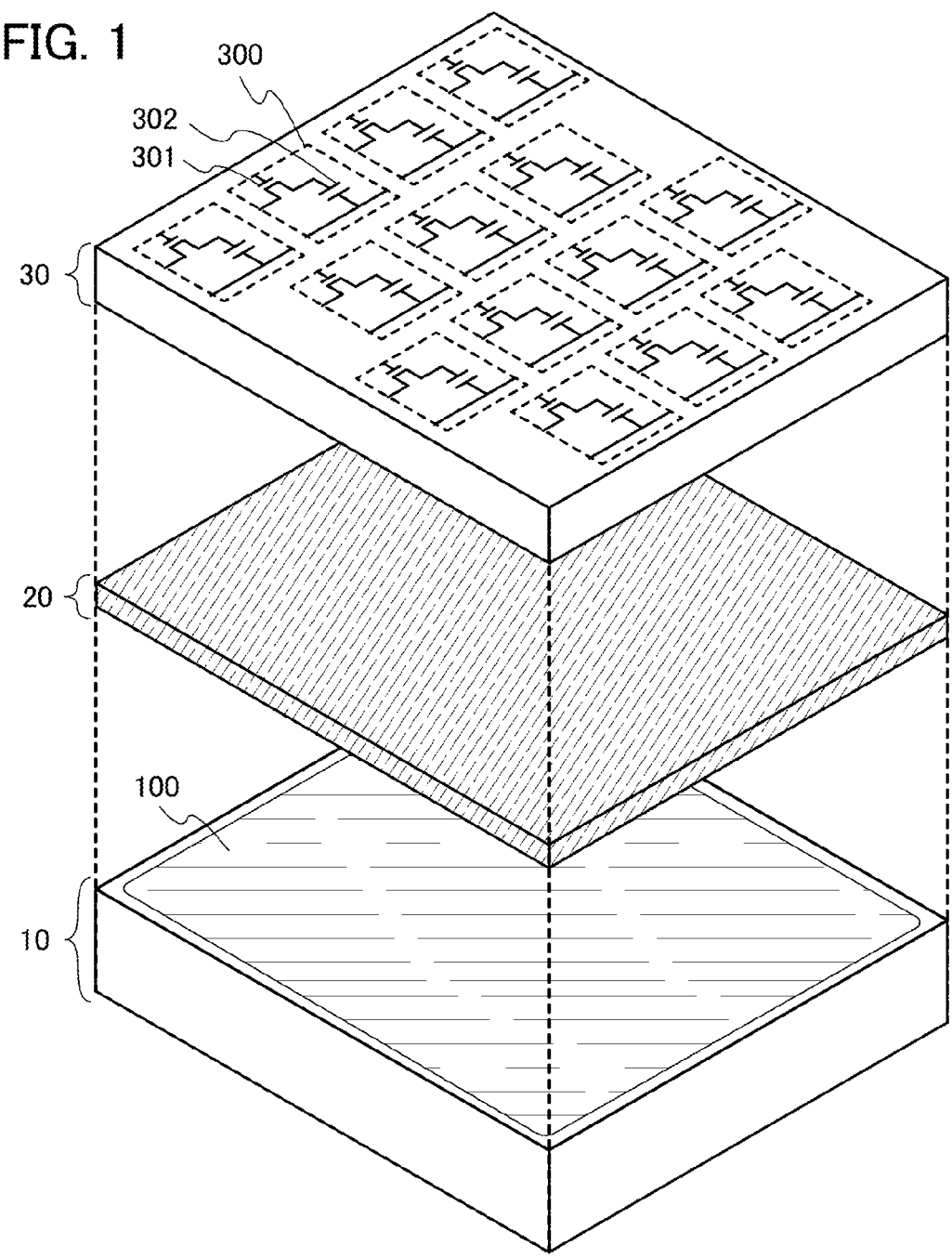

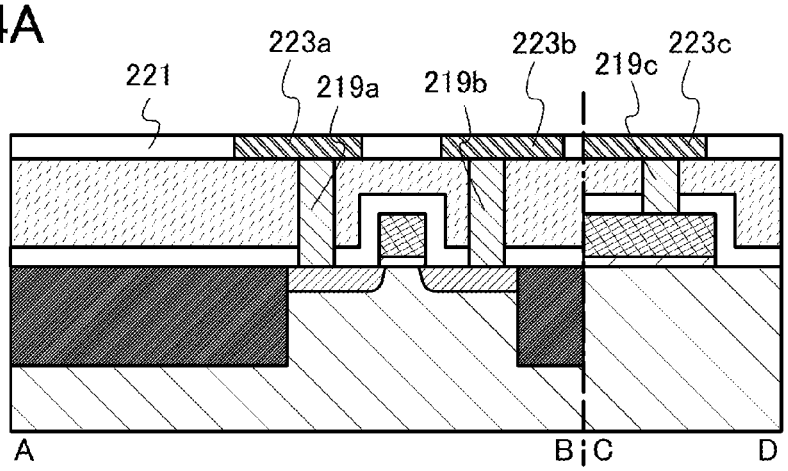
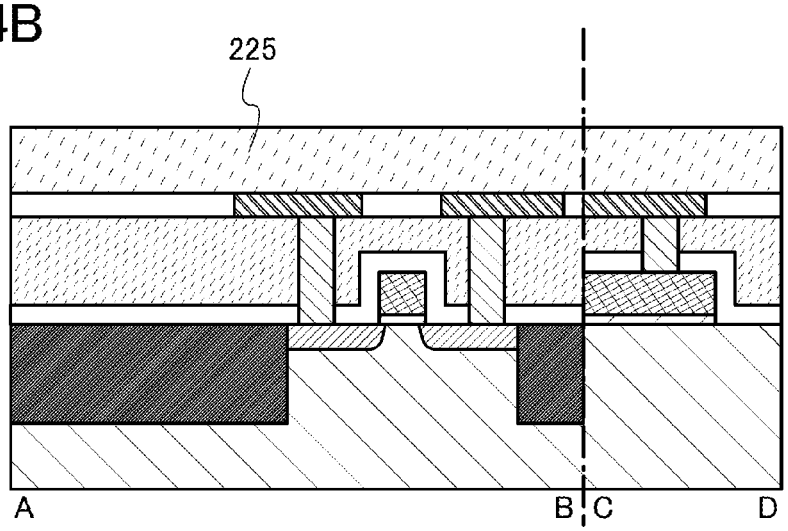
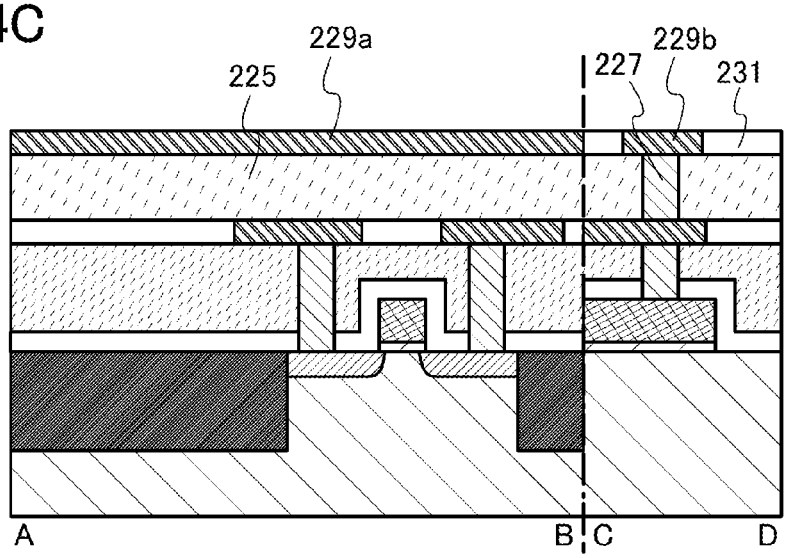

SEMICONDUCTOR STORAGE DEVICE COMPRISING PERIPHERAL CIRCUIT, SHIELDING LAYER, AND MEMORY CELL ARRAY

BACKGROUND OF THE INVENTION

1. Field of the Invention

The present invention relates to a semiconductor storage device.

2. Description of the Related Art

In recent years, a metal oxide having semiconductor characteristics (hereinafter referred to as an oxide semiconductor material) has attracted attention as a material for an active layer of a transistor. A transistor including an oxide semiconductor material as a material for an active layer can be manufactured through a process similar to that of a transistor including amorphous silicon as a material for an active layer and has higher mobility than the transistor including amorphous silicon. Therefore, the transistor including an oxide semiconductor material as a material for an active layer has been expected to replace or excel the transistor including amorphous silicon as a material for an active layer. For example, the transistor including an oxide semiconductor material as a material for an active layer has been expected to be used as a transistor provided in each pixel in an active matrix display device.

Further, the transistor including an oxide semiconductor material for an active layer has small off-state current. Thus, a potential of a node (the amount of charge held in the node) which is brought into a floating state when the transistor is turned off can be held for a long time. Accordingly, it is expected that a semiconductor storage device is formed using the transistor. For example, Patent Document 1 discloses a dynamic random access memory (DRAM) including the transistor in a memory cell.

The transistor including an oxide semiconductor material for an active layer is formed by deposition and processing of a variety of thin films. Therefore, the transistor can be formed in a region overlapping with a region where another semiconductor element exists. For example, Patent Document 2 discloses a semiconductor device which includes two kinds of transistors stacked: a transistor (transistor in a lower portion) in which an active layer is formed using a semiconductor substrate and a transistor (transistor in an upper layer) in which an active layer is formed using an oxide semiconductor material.

REFERENCE

[Patent Documents]

[Patent Document 1] Japanese Published Patent Application No. 2011-109084

[Patent Document 2] Japanese Published Patent Application No. 2011-119672

SUMMARY OF THE INVENTION

A DRAM includes a memory cell array and a peripheral circuit. The memory cell array includes a plurality of memory cells each of which holds an amount of charge corresponding to data. The peripheral circuit performs reading, writing, refreshing, and the like of data on the memory cells.

Specifically, each of the memory cells includes a transistor and a capacitor. When the transistor is turned off, a potential of a node to which one of electrodes of the capacitor is electrically connected is brought into a floating state; thus, desired data (desired amount of charge) is held in the node (one of the electrodes of the capacitor).

The peripheral circuit controls a potential of a signal line (bit line) whose electrical connection with the one of the electrodes of the capacitor is controlled by the transistor. When the transistor is turned on, desired data is written in the memory cell. After a value of a potential of the bit line is set to a predetermined value by the peripheral circuit, the transistor is made to be turned on by the peripheral circuit; thus, the potential of the bit line is changed in accordance with the data. Further, data held in the memory cell is read by detection of the potential of the bit line. Furthermore, the peripheral circuit replenishes the memory cell with charge at a desired refresh rate (refresh).

In the case where a transistor including an oxide semiconductor material for an active layer is used as the transistor in the memory cell, the refresh rate can be decreased. Further, high integration of a DRAM can be achieved by stacking of a memory cell array and a peripheral circuit. Specifically, a peripheral circuit is formed using a single crystal silicon substrate and a memory cell array is formed using an oxide semiconductor material formed over the single crystal silicon substrate. Thus, the DRAM can be highly integrated as compared to the case where a memory cell array and a peripheral circuit are formed over the same plane.

Note that in the case where a memory cell array and a peripheral circuit are stacked, there is high probability that radiation noise is generated between the memory cell array and the peripheral circuit. Accordingly, probability of malfunction due to radiation noise at the time of reading data in the DRAM becomes high. This is because such operation is performed by detection of change in the potential of the bit line, as described above.

In view of the foregoing, an object of an embodiment of the present invention is to reduce probability that malfunction of a semiconductor storage device is caused.

The above object can be achieved in such a manner that a shielding layer is provided between the memory cell array and the peripheral circuit.

For example, an embodiment of the present invention is a semiconductor storage device including a memory cell array including a plurality of memory cells, a peripheral circuit including a reading circuit which reads data held in the memory cell, and a shielding layer which is provided between the memory cell array and the peripheral circuit and whose potential is kept constant. Each of the memory cells holds an amount of charge in accordance with data. The reading circuit reads the data by detecting a potential of a signal line whose potential is changed in accordance with the amount of charge held in the memory cell.

Another embodiment of the present invention is a semiconductor storage device including a peripheral circuit including a semiconductor element formed using a semiconductor substrate, a shielding layer which is provided over the peripheral circuit and formed using a conductive material, and a memory cell array which is provided over the shielding layer and includes a semiconductor element formed using an oxide semiconductor material. The memory cell array includes a plurality of memory cells each of which holds an amount of charge in accordance with data. The peripheral circuit includes a reading circuit which reads data by detecting a potential of a signal line whose potential is changed in accordance with the amount of charge held in the memory cell.

The semiconductor storage device according to an embodiment of the present invention includes the shielding layer between the memory cell array and the peripheral circuit; thus, the memory cell array and the peripheral circuit can be shielded from radiation noise generated between the memory cell array and the peripheral circuit. Accordingly, probability that malfunction of the semiconductor storage device is caused can be reduced.

BRIEF DESCRIPTION OF THE DRAWINGS

In the accompanying drawings:

FIG. 1 illustrates a structural example of a semiconductor storage device;

FIGS. 4A to 4C are schematic cross-sectional views illustrating a structural example of a semiconductor storage device and manufacturing steps thereof;

DETAILED DESCRIPTION OF THE INVENTION

Figure 2A:
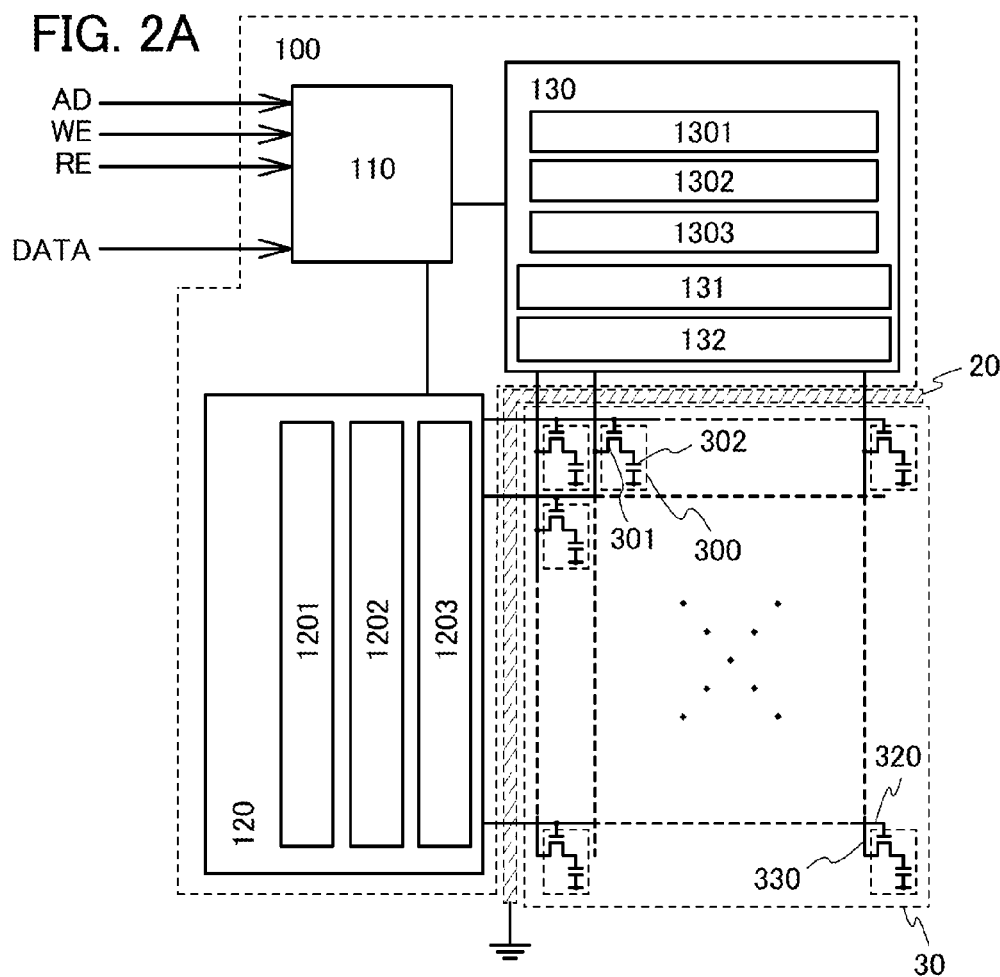
FIG. 2A illustrates a structural example of a peripheral circuit and FIG. 2B is a schematic view of an embodiment of connection between a peripheral circuit and a memory cell array.

Embodiments of the present invention will be described below in detail. Note that the present invention is not limited to the description below, and a variety of changes can be made without departing from the spirit and scope of the present invention. Therefore, the present invention should not be construed as being limited to the description below.

<Structural Example of Semiconductor Storage Device>

FIG. 1 illustrates a structural example of a semiconductor storage device of an embodiment of the present invention. The semiconductor storage device illustrated in FIG. 1 includes a peripheral circuit 100 including a semiconductor element formed using a semiconductor substrate 10, a shielding layer 20 which is provided over the peripheral circuit 100 and formed using a conductive material, and a memory cell array 30 which is provided over the shielding layer 20 and includes a semiconductor element formed using an oxide semiconductor material. The memory cell array 30 illustrated in FIG. 1 includes a plurality of memory cells 300 each holding charge in accordance with data. Specifically, each of the memory cells 300 includes a transistor 301 in which an active layer is formed using an oxide semiconductor material and a capacitor 302 one electrode of which is electrically connected to a node which is brought into a floating state when the transistor 301 is turned off. Note that the other electrode of the capacitor 302 is electrically connected to a wiring kept at a fixed potential. For example, a ground potential, 0 V, or the like can be used as the fixed potential.

The shielding layer 20 is provided in order to shield the peripheral circuit 100 and the memory cell array 30 from radiation noise generated between the peripheral circuit 100 and the memory cell array 30. Therefore, it is preferable that a region provided with the shielding layer 20 overlap with at least one of a region provided with the peripheral circuit 100 and a region provided with the memory cell array 30. This is because a region where the shielding layer 20 is not provided between the peripheral circuit 100 and the memory cell array 30 cannot be shielded from radiation noise.

<Structural Example of Peripheral Circuit 100>

FIG. 2A is a block diagram of a structure of the peripheral circuit 100 of the semiconductor storage device illustrated in FIG. 1. The peripheral circuit 100 illustrated in FIG. 2A includes a control circuit 110, a word line driver circuit 120, and a bit line driver circuit 130. The word line driver circuit 120 controls potentials of a plurality of word lines 320 provided in the memory cell array 30. The word lines 320 are electrically connected to gates of the plurality of transistors 301. In other words, the word line driver circuit 120 controls switching of the transistors 301 provided in the memory cell array 30. The bit line driver circuit 130 controls and detects potentials of a plurality of bit lines 330 provided in the memory cell array 30. The bit lines 330 are electrically connected to sources or drains of the plurality of transistors 301. In other words, the bit line driver circuit 130 performs writing and reading data on the memory cells 300 provided in the memory cell array 30. The control circuit 110 controls operations of the word line driver circuit 120 and the bit line driver circuit 130.

The word line driver circuit 120 includes a decoder 1201, a level shifter 1202, a buffer 1203, and the like. The bit line driver circuit 130 includes a decoder 1301, a level shifter 1302, a selector 1303, a writing circuit 131, a reading circuit 132, and the like. Between the peripheral circuit 100 and the memory cell array 30 is provided the shielding layer 20 supplied with a ground potential. Note that the potential supplied to the shielding layer 20 is not limited to a ground potential. It is possible to supply a fixed potential different from a ground potential to the shielding layer 20.

An example of operation of the peripheral circuit 100 illustrated in FIG. 2A is described below.

When an address signal (AD), and a read enable signal (RE) or a write enable signal (WE) are input to the peripheral circuit 100, the control circuit 110 controls the word line driver circuit 120 and the bit line driver circuit 130. Thus, writing or reading data is performed in a corresponding memory cell 300.

For example, in the case where data is written in a desired memory cell 300, a signal for making the decoder 1201 select one of the plurality of word lines 320 is generated in the word line driver circuit 120. After a potential of the signal is adjusted by the level shifter 1202 and a waveform of the signal is processed by the buffer 1203, the signal is supplied to the selected word line 320. Thus, the transistors 301 whose gates are electrically connected to the word line 320 are turned on. Then, a signal for making the decoder 1301 select one of the plurality of bit lines 330 is generated in the bit line driver circuit 130. After a potential of the signal is adjusted by the level shifter 1302, the signal is input to the selector 1303. In the selector 1303, a data signal (DATA) is sampled in accordance with the input signal. The sampled data is supplied to the selected bit line 330 by the writing circuit 131. Thus, desired data can be written in the selected memory cell 300.

In the case where data is read from a desired memory cell 300, a predetermined potential is supplied from the bit line driver circuit 130 to a bit line 330 electrically connected to the desired memory cell 300. Then, the bit line 330 is brought into a floating state. After that, the word line driver circuit 120 operates in a manner similar to the case of writing data. In other words, the transistor 301 included in the memory cell 300 is turned on. Thus, a potential of the bit line 330 is changed in accordance with the data held in the memory cell 300. Then, change in the potential of the bit line 330 is detected by the reading circuit 132 included in the bit line driver circuit 130. Thus, the data held in the memory cell 300 can be read.

<An Embodiment of Connection Between Peripheral Circuit 100 and Memory Cell Array 30>

Figure 2B:
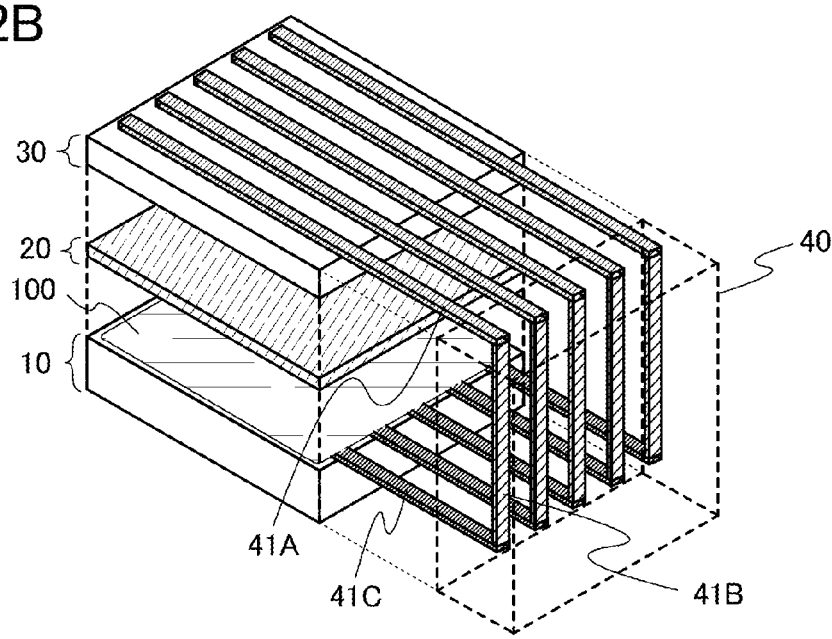

FIG. 2B is a schematic view illustrating an embodiment of connection between the peripheral circuit 100 and the memory cell array 30 included in the semiconductor storage device illustrated in FIG. 1. The semiconductor storage device illustrated in FIG. 2B includes the structure illustrated in FIG. 1 and a connection wiring portion 40 provided close to the structure. The connection wiring portion 40 includes part of each of a plurality of wirings 41A extending from the memory cell array 30, a plurality of wirings 41B, and part of each of a plurality of wirings 41C extending from the peripheral circuit 100. The wirings 41B extend parallel or substantially parallel to a direction in which the peripheral circuit 100, the shielding layer 20, and the memory cell array 30 are stacked.

In the connection wiring portion 40 illustrated in FIG. 2B, the wirings 41A, the wirings 41B, and the wirings 41C are connected to one another. In other words, in the semiconductor storage device illustrated in FIG. 2B, each wiring (e.g., the word line 320 or the bit line 330 illustrated in FIG. 2A) for electrically connecting the peripheral circuit 100 and the memory cell array 30 includes the wiring 41A, the wiring 41B, and the wiring 41C.

In the semiconductor storage device including the connection wiring portion 40, an opening through which the peripheral circuit 100 is electrically connected to the memory cell array 30 does not need to be provided in the shielding layer 20. Therefore, the shielding layer 20 provided between the peripheral circuit 100 and the memory cell array 30 can be formed with a film without any opening. Thus, in the semiconductor storage device, effect of shielding the peripheral circuit 100 and the memory cell array 30 from radiation noise generated between the peripheral circuit 100 and the memory cell array 30 can be increased.

<Structural Example of Semiconductor Storage Device>

FIGS. 3A to 3D, FIGS. 4A to 4C, FIGS. 5A and 5B, FIGS. 6A and 6B, and FIGS. 7A and 7B are schematic cross-sectional views illustrating a structural example and manufacturing steps of the semiconductor storage device disclosed in this specification. Specifically, cross sections A-B in FIGS. 3A to 3D, FIGS. 4A to 4C, FIGS. 5A and 5B, FIGS. 6A and 6B, and FIGS. 7A and 7B are schematic cross-sectional views illustrating a structural example and manufacturing steps of the transistor (the transistor formed using a semiconductor substrate) included in the peripheral circuit 100 illustrated in FIG. 1, the shielding layer 20 illustrated in FIG. 1, and the transistor (the transistor formed using an oxide semiconductor material) included in the memory cell array 30 illustrated in FIG. 1, and cross-sections C-D in FIGS. 3A to 3D, FIGS. 4A to 4C, FIGS. 5A and 5B, FIGS. 6A and 6B, and FIGS. 7A and 7B are schematic cross-sectional views illustrating a structural example and manufacturing steps of the wiring (the connection wiring portion 40 illustrated in FIG. 2B) for electrically connecting the peripheral circuit 100 and the memory cell array 30 illustrated in FIG. 1.

Figure 3A:
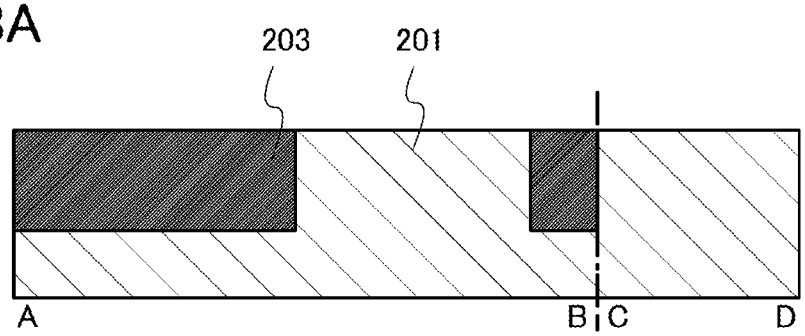
FIGS. 3A to 3D are schematic cross-sectional views illustrating a structural example of a semiconductor storage device and manufacturing steps thereof.

First, as illustrated in FIG. 3A, element isolation regions 203 are formed in a p-type semiconductor substrate 201.

As the p-type semiconductor substrate 201, a single crystal silicon substrate (a silicon wafer) having p-type conductivity or a compound semiconductor substrate (e.g., a SiC substrate, a sapphire substrate, or a GaN substrate) can be used.

Instead of the p-type semiconductor substrate 201, the following substrate may be used as a silicon on insulator (SOI) substrate: a so-called separation by implanted oxygen (SIMOX) substrate which is formed in such a manner that after an oxygen ion is implanted into a mirror-polished wafer, an oxide layer is formed at a certain depth from the surface and defects generated in a surface layer are eliminated by high temperature heating; or an SOI substrate formed by a technique called a Smart-Cut method in which a semiconductor substrate is cleaved by utilizing the thermally induced growth of a minute void formed by implantation of a hydrogen ion, an epitaxial layer transfer (ELTRAN: a registered trademark of Canon Inc.) method, or the like.

The element isolation regions 203 are formed by a LOCOS (local oxidation of silicon) method, an STI (shallow trench isolation) method, or the like.

In the case where a p-channel transistor is formed over the same substrate, an n-well region may be formed in part of the p-type semiconductor substrate 201. The n-well region is formed by addition of an impurity element imparting n-type conductivity, such as phosphorus or arsenic.

Although the p-type semiconductor substrate is used here, a p-channel transistor may be formed using an n-type semiconductor substrate. In that case, a p-well region to which an impurity element imparting p-type conductivity, such as boron, is added may be formed in the n-type semiconductor substrate and an n-channel transistor may be formed over the same substrate.

Figure 3B:
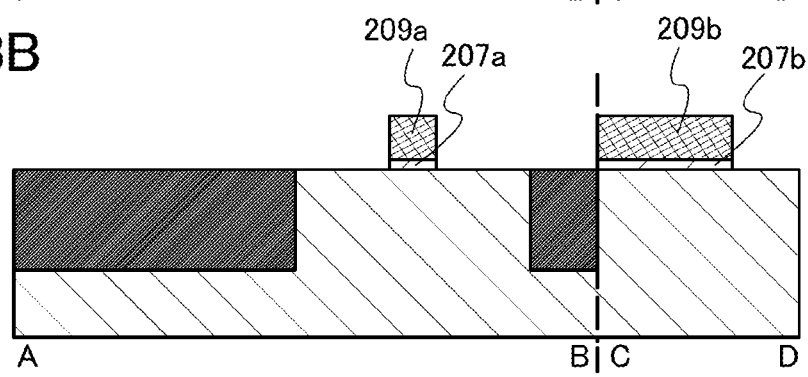

Next, as illustrated in FIG. 3B, a gate insulating film 207a, an insulating film 207b, a gate electrode 209a, and a wiring 209b are formed over the semiconductor substrate 201.

For example, a surface of the semiconductor substrate 201 is oxidized by thermal treatment, or nitridation treatment may be further performed after the oxidization. Thus, a silicon oxide film, or a stack of a silicon oxide film and a silicon film containing oxygen and nitrogen (silicon oxynitride film) is formed. Next, part of the silicon oxide film or part of the silicon oxynitride film is selectively etched, so that the gate insulating film 207a and the insulating film 207b are formed. Alternatively, the gate insulating film 207a and the insulating film 207b may be formed in such a manner that silicon oxide, silicon oxynitride, a metal oxide such as tantalum oxide, hafnium oxide, hafnium silicate oxide, zirconium oxide, aluminum oxide, or titanium oxide, which is a high dielectric constant material (also referred to as a high-k material), a rare-earth oxide such as lanthanum oxide, or the like is formed to have a thickness of 5 nm to 50 nm by a CVD method, a sputtering method, or the like, and then part thereof is selectively etched.

It is preferable that the gate electrode 209a and the wiring 209b be formed using a metal selected from tantalum, tungsten, titanium, molybdenum, chromium, niobium, and the like, or an alloy material or a compound material including any of the metals as its main component. Further, polycrystalline silicon to which an impurity such as phosphorus is added can be used. Alternatively, the gate electrode 209a and the wiring 209b may have a stacked structure including a metal nitride film and a film of any of the above metals. As the metal nitride, tungsten nitride, molybdenum nitride, or titanium nitride can be used. When the metal nitride film is provided, adhesiveness of the metal film can be increased; accordingly, separation can be prevented.

The gate electrode 209a and the wiring 209b are formed in such a manner that a conductive film is formed by a sputtering method, a CVD method, or the like and then part of the conductive film is selectively etched.

Note that for high integration, a structure in which a sidewall insulating layer is not provided on a side surface of the gate electrode 209a is preferable. On the other hand, when the characteristics of the transistor have priority, a sidewall insulating layer may be provided on the side surface of the gate electrode 209a.

Figure 3C:
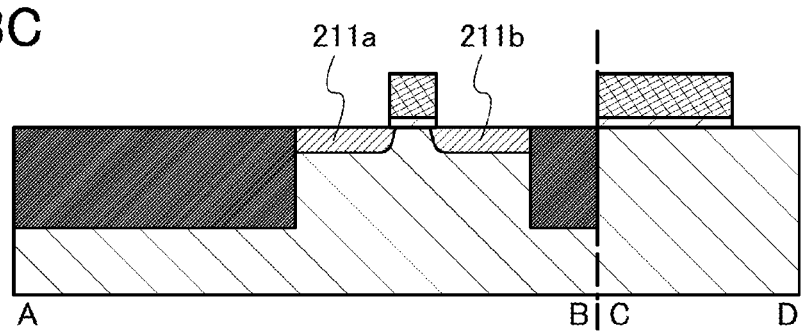

Next, as illustrated in FIG. 3C, an impurity element imparting n-type conductivity is added to the semiconductor substrate 201, so that an n-type impurity region 211a and an n-type impurity region 211b are formed. In the case where an n-well region is formed in the same substrate, p-type impurity regions are formed by addition of an impurity element imparting p-type conductivity to the n-well region. The concentration of the impurity element imparting n-type conductivity in the n-type impurity regions 211a and 211b is higher than or equal to $1\times10^{19}/cm^3$ and lower than or equal to $1\times10^{21}/cm^3$, and the concentration of the impurity element imparting p-type conductivity in the p-type impurity regions is higher than or equal to $1\times10^{19}/cm^3$ and lower than or equal to $1\times10^{21}/cm^3$. The impurity element imparting n-type conductivity and the impurity element imparting p-type conductivity are added to the semiconductor substrate 201 and the n-well region, respectively, by an ion doping method, an ion implantation method, or the like as appropriate.

In the case where a sidewall insulating layer is formed on the side surface of the gate electrode 209a, an impurity region having an impurity concentration different from that in the n-type impurity regions 211a and 211b and that in the p-type impurity regions can be formed in a region overlapping with the sidewall insulating layer.

Figure 3D:
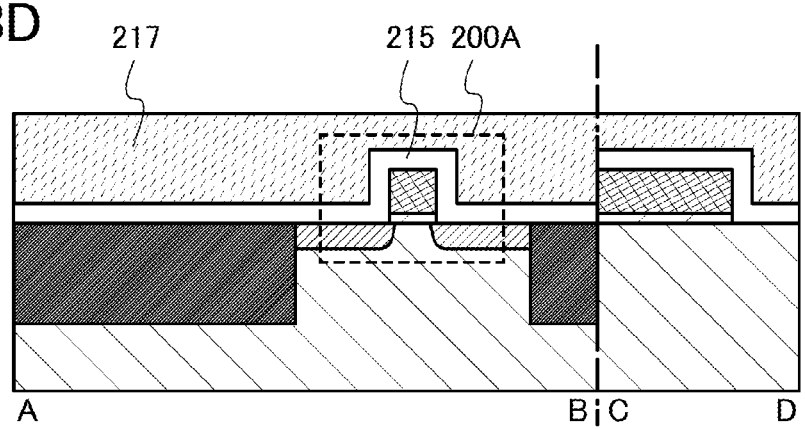

Next, as illustrated in FIG. 3D, an insulating film 215 and an insulating film 217 are formed by a sputtering method, a CVD method, or the like over the semiconductor substrate 201, the element isolation regions 203, the gate insulating film 207a, the insulating film 207b, the gate electrode 209a, and the wiring 209b.

The insulating films 215 and 217 may each be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. When the insulating film 215 is formed by a CVD method, a hydrogen content of the insulating film 215 can be increased. Heat treatment is performed using such an insulating film 215, whereby it is possible to hydrogenate the semiconductor substrate, to terminate a dangling bond by hydrogen, and to reduce defects in the semiconductor substrate.

Note that planarity of the insulating film 217 can be high when the insulating film 217 is formed using an inorganic material such as borophosphosilicate glass (BPSG), or an organic material such as polyimide or acrylic.

After the formation of the insulating film 215 or the insulating film 217, heat treatment is performed to activate the impurity elements added to the n-type impurity regions 211a and 211b and the p-type impurity regions.

Through the above steps, as illustrated in FIG. 3D, an n-channel transistor 200A can be manufactured.

Next, part of each of the insulating films 215 and 217 is selectively etched to form opening portions. Then, contact plugs 219a, 219b, and 219c are formed in the opening portions. Typically, the contact plugs 219a to 219c are formed in such a manner that after a conductive film is formed by a sputtering method, a CVD method, or the like, planarization treatment is performed by a chemical mechanical polishing (CMP) method, etching, or the like, and an unnecessary portion of the conductive film is removed (see FIG. 4A).

The conductive film to be the contact plugs 219a to 219c is formed in such a manner that tungsten silicide is formed by a CVD method using a $WF_6$ gas and a $SiH_4$ gas to fill the opening portions.

Next, an insulating film is formed by a sputtering method, a CVD method, or the like over the insulating film 217 and the contact plugs 219a to 219c, and then, part of the insulating film is selectively etched to form an insulating film 221 having a groove portion. Next, after a conductive film is formed by a sputtering method, a CVD method, or the like, planarization treatment is performed by a CMP method, etching, or the like, and an unnecessary portion of the conductive film is removed; thus, wirings 223a, 223b, and 223c are formed (see FIG. 4A).

Here, the wirings 223a and 223b function as source and drain electrodes of the transistor.

The insulating film 221 can be formed using a material similar to that of the insulating film 215.

The wirings 223a to 223c are formed to have a single-layer structure or a stacked-layer structure including any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used.

Next, an insulating film 225 is formed by a sputtering method, a CVD method, or the like over the insulating film 221 and the wirings 223a to 223c (see FIG. 4B). The insulating film 225 is formed with a single layer or a stack including one or more of silicon oxide, silicon oxynitride, silicon nitride oxide, gallium oxide, hafnium oxide, yttrium oxide, aluminum oxide, and aluminum oxynitride.

Next, part of the insulating film 225 is selectively etched to form an opening portion. Then, a contact plug 227 is formed in the opening portion. Note that the contact plug 227 can be formed using a method and a material similar to those of the contact plugs 219a and 219b (see FIG. 4C).

Next, an insulating film is formed over the insulating film 225 and the contact plug 227 by a sputtering method, a CVD method, or the like, and after that, part of the insulating film is selectively etched to form an insulating film 231. Subsequently, a conductive film is formed by a sputtering method, a CVD method, or the like and then subjected to planarization treatment such as a CMP method or etching so that an unnecessary portion of the conductive film is removed, thereby forming a conductive film 229a and a wiring 229b (see FIG. 4C).

Note that the conductive film 229a is a conductive film serving as the shielding layer 20 in the semiconductor storage device illustrated in FIG. 1 and FIGS. 2A and 2B.

The conductive film 229a and the wiring 229b can be formed using a material similar to that of the wirings 223a to 223c. The insulating film 231 can be formed using a material similar to those of the insulating film 215 and the insulating film 221.

Next, an insulating film 233 is formed over the conductive film 229a, the wiring 229b, and the insulating film 231 by a sputtering method, a CVD method, or the like. The insulating film 233 can be formed using a material similar to that of the insulating film 225. The insulating film 233 is preferably formed using an oxide insulating film from which part of oxygen is released by heating. The oxide insulating film from which part of oxygen is released by heating is preferably an oxide insulating film which contains oxygen at a proportion exceeding the stoichiometric proportion. Oxygen is released by heating from the oxide insulating film from which part of oxygen is released by heating; therefore, oxygen can be diffused into an oxide semiconductor film by heating performed in a later step (see FIG. 5A).

The insulating film 233 is preferably planarized by CMP treatment or the like. The surface of the insulating film 233 has an average surface roughness (Ra) of 1 nm or less, preferably 0.3 nm or less, further preferably 0.1 nm or less.

The CMP treatment may be performed once or plural times. When the CMP treatment is performed plural times, first polishing is preferably performed with a high polishing rate followed by final polishing with a low polishing rate. By performing polishing steps with different polishing rates in combination, the planarity of the surface of the insulating film 233 can be further increased.

Alternatively, plasma treatment can be used as the planarization treatment of the insulating film 233. The plasma treatment is performed in such a manner that an inert gas, for example, a rare gas such as an argon gas is introduced into a vacuum chamber and an electric field is applied so that a surface to be processed serves as a cathode. The plasma treatment has a principle similar to that of a plasma dry etching method and an inert gas is used in the plasma treatment. In other words, the plasma treatment is treatment in which the surface to be processed is irradiated with ions of an inert gas and minute unevenness of the surface is reduced by a sputtering effect. Therefore, the plasma treatment can also be referred to as "reverse sputtering treatment".

In the plasma treatment, electrons and argon cations are present in plasma and the argon cations are accelerated in a cathode direction. The surface to be processed is sputtered by the accelerated argon cations. At this time, a projecting portion of the surface to be processed is preferentially sputtered. Particles generated by sputtering from the surface to be processed are attached to another place of the surface to be processed. At this time, the particles preferentially are attached to a depressed portion of the surface to be processed. In this manner, by reducing the projecting portion and filling the depressed portion, the planarity of the surface to be processed can be improved. Note that a combination of plasma treatment and CMP treatment can further planarize the insulating film 233.

Note that through the plasma treatment, it is possible to remove impurities such as oxygen, moisture, and an organic substance attached onto the surface of the insulating film 233 by a sputtering effect.

It is preferable that impurities such as hydrogen, water, a hydroxyl group, and a hydride in a deposition chamber be removed by heating and evacuation of the deposition chamber before formation of the oxide semiconductor. It is particularly important to remove such impurities adsorbed on an inner wall of the deposition chamber. Here, the heat treatment may be performed at a temperature of higher than or equal to 100° C. and lower than or equal to 450° C., for example. Evacuation of the deposition chamber is preferably performed with a rough vacuum pump such as a dry pump, and a high vacuum pump such as a sputter ion pump, a turbo molecular pump, or a cryopump, in appropriate combination. The turbo molecular pump has an outstanding capability in evacuating a large-sized molecule, whereas it has a low capability in evacuating hydrogen or water. Hence, combination with a cryopump having a high capability in evacuating water or a sputter ion pump having a high capability in evacuating hydrogen is effective. At this time, when the impurities are removed while an inert gas is introduced, the rate of desorption of water or the like, which is difficult to desorb only by evacuation, can be further increased. Removal of impurities in the deposition chamber by such treatment before the film formation of the oxide semiconductor can prevent hydrogen, water, a hydroxyl group, a hydride, and the like from entering the oxide semiconductor.

Before the oxide semiconductor film is formed by a sputtering apparatus, a dummy substrate may be put into the sputtering apparatus, and an oxide semiconductor film may be formed over the dummy substrate, so that hydrogen and moisture attached to the target surface or a deposition shield may be removed.

Figure 5A:
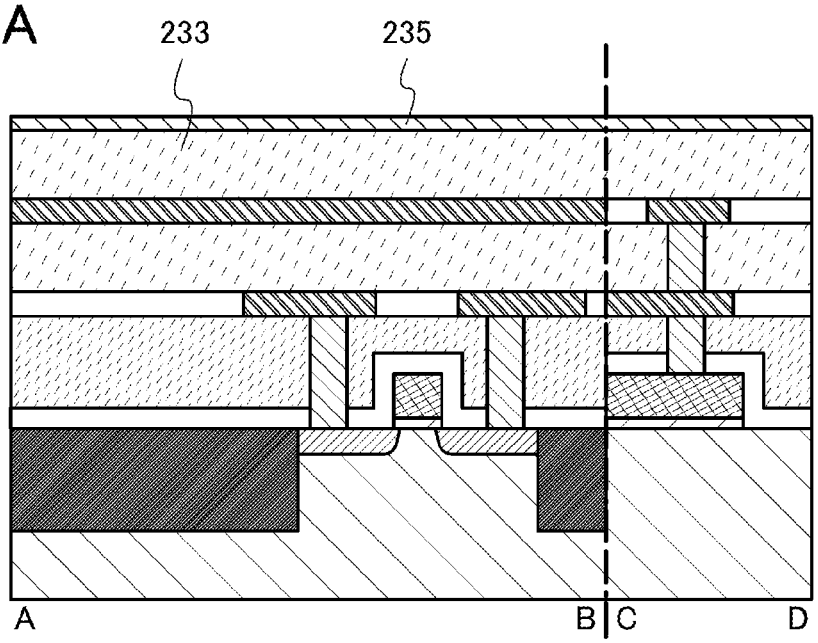
FIGS. 5A and 5B are schematic cross-sectional views illustrating a structural example of a semiconductor storage device and manufacturing steps thereof.
Figure 5B:
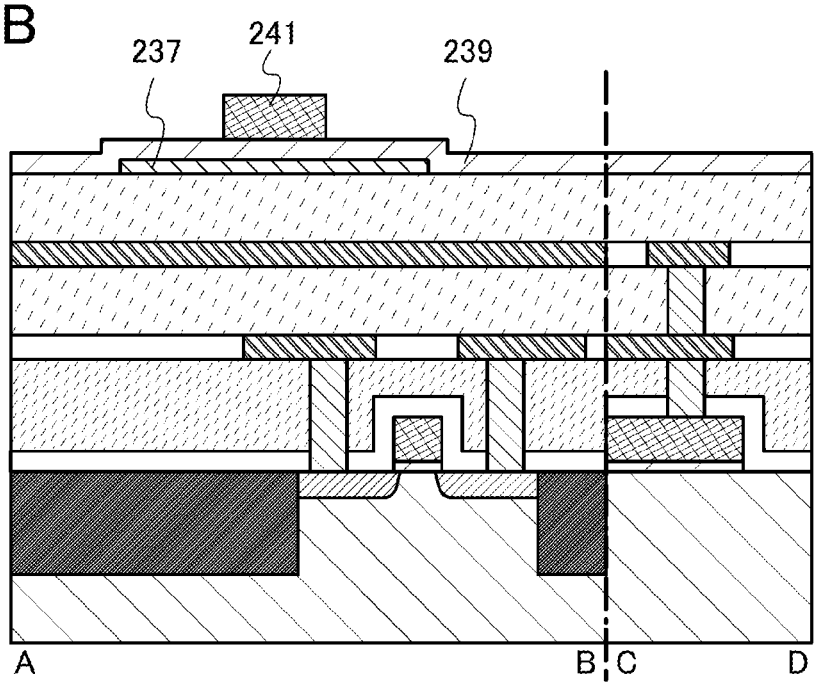

Next, an oxide semiconductor film 235 is formed over the insulating film 233 by a sputtering method, a coating method, a printing method, an evaporation method, a PCVD method, a PLD method, an ALD method, an MBE method, or the like (see FIG. 5A). Here, as the oxide semiconductor film 235, an oxide semiconductor film having a thickness of greater than or equal to 1 nm and less than or equal to 50 nm, preferably greater than or equal to 3 nm and less than or equal to 20 nm is formed by a sputtering method. When the oxide semiconductor film 235 has a thickness in the above range, a short-channel effect which might be caused due to miniaturization of the transistor can be suppressed.

An oxide semiconductor used for the oxide semiconductor film 235 preferably contains at least indium (In) or zinc (Zn). In particular, In and Zn are preferably contained. As a stabilizer for reducing variation in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. Further, silicon oxide may be included in the above oxide semiconductor. Here, for example, an In—Ga—Zn-based oxide means an oxide containing indium (In), gallium (Ga), and zinc (Zn) as its main components and there is no particular limitation on the atomic ratio. The In—Ga—Zn-based oxide may contain a metal element other than In, Ga, and Zn. In this case, the amount of oxygen in the oxide semiconductor preferably exceeds the stoichiometric proportion. When the amount of oxygen exceeds the stoichiometric proportion, generation of carriers which results from oxygen vacancies in the oxide semiconductor film can be suppressed.

Alternatively, a material represented by $InMO_3(ZnO)_m$ (m>0, and m is not an integer) may be used as the oxide semiconductor. Note that M represents one or more metal elements selected from Ga, Fe, Mn, and Co. Alternatively, as the oxide semiconductor, a material represented by $In_2SnO_5(ZnO)_n$ (n>0, and n is an integer) may be used.

Note that the concentration of an alkali metal or an alkaline earth metal in the oxide semiconductor film 235 is preferably lower than or equal to $1 \times 10^{18}$ atoms/cm$^3$, more preferably lower than or equal to $2 \times 10^{16}$ atoms/cm$^3$. When an alkali metal or an alkaline earth metal is bonded to an oxide semiconductor, carriers are generated in some cases, which cause an increase in the off-state current of the transistor.

The oxide semiconductor film 235 may contain nitrogen at a concentration of lower than or equal to $5 \times 10^{18}$ atoms/cm$^3$.

As an oxide semiconductor which can be used for the oxide semiconductor film 235, a wide bandgap semiconductor which has a wider bandgap and lower intrinsic carrier density than silicon is used. The off-state current of a transistor can be reduced with the use of an oxide semiconductor having a wide energy gap.

The oxide semiconductor film 235 may have a single crystal structure or a non-single-crystal structure. In the latter case, the oxide semiconductor film 235 may have either an amorphous structure or a polycrystal structure. Further, the oxide semiconductor film 235 may have an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when surface flatness is improved, mobility higher than that of an oxide semiconductor in an amorphous state can be obtained. In order to improve the surface flatness, the oxide semiconductor is preferably formed over a flat surface. As described above, the average surface roughness (Ra) of the surface of the insulating film 233 is 1 nm or less, preferably 0.3 nm or less, further preferably 0.1 nm or less, and the oxide semiconductor film 235 is preferably formed thereover.

Here, the oxide semiconductor film 235 is formed by a sputtering method.

For example, as a target used in the sputtering method, the following can be given: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also represented as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

In the case where an In—Ga—Zn—O-based material is used as an oxide semiconductor, the atomic ratio of metal elements in a target to be used may be In:Ga:Zn=1:1:1, 4:2:3, 3:1:2, 1:1:2, 2:1:3, 3:1:4, or the like. A target of an In—Ga—Zn-based oxide having any of the above atomic ratios or an oxide whose composition is close to the above compositions can be used. When the target has any of the above atomic ratios, a polycrystalline film or a CAAC-OS (c-axis aligned crystalline oxide semiconductor) film described later is likely to be formed.

In the case where an In—Sn—Zn—O-based material is used as an oxide semiconductor, the atomic ratio of metal elements in a target to be used may be In:Sn:Zn=1:1:1, 2:1:3, 1:2:2, 20:45:35, or the like. A target of an In—Sn—Zn-based oxide having any of the above atomic ratios or an oxide whose composition is close to the above compositions can be used. When the target has any of the above atomic ratios, a polycrystalline film or a CAAC-OS film described later is likely to be formed.

In the case where an In—Zn—O-based material is used as the oxide semiconductor, the atomic ratio of metal elements in a target to be used is In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), more preferably In:Zn=15:1 to 1.5:1 ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied. A target of an In—Zn—O-based oxide having any of the above atomic ratios or an oxide whose composition is close to the above compositions can be used.

However, the composition is not limited to those described above, and a material having the appropriate composition may be used depending on necessary semiconductor characteristics (e.g., mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. However, the mobility can be increased by reducing the defect density in the bulk also in the case of using the In—Ga—Zn-based oxide.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen is preferably higher than that of a rare gas. Further, in order to prevent hydrogen, water, a hydroxyl group, a hydride, and the like from entering the oxide semiconductor film, as a sputtering gas, it is preferable to use an atmosphere of a high-purity gas from which impurities such as hydrogen, water, a hydroxyl group, and a hydride are sufficiently removed.

In a sputtering method, an RF power supply device, an AC power supply device, a DC power supply device, or the like can be used as a power supply device for generating plasma as appropriate.

The leakage rate of a treatment chamber in which the oxide semiconductor film is formed is preferably lower than or equal to $1 \times 10^{-10}$ Pa·m$^3$/sec., whereby entry of an impurity into the film to be formed by a sputtering method can be decreased. As described above, in the process for forming the oxide semiconductor film and preferably in the process for forming the oxide insulating film, entry of impurities is suppressed as much as possible through control of the pressure of the treatment chamber, leakage rate of the treatment chamber, and the like, whereby entry of impurities including hydrogen into the oxide semiconductor film can be reduced. In addition, diffusion of impurities such as hydrogen from the oxide insulating film to the oxide semiconductor film can be reduced.

As the oxide semiconductor film 235, a CAAC-OS film may be used.

The CAAC-OS film is not completely single crystal nor completely amorphous. The CAAC-OS film is an oxide semiconductor film with a crystal-amorphous mixed phase structure where crystal portions are included in an amorphous phase. Note that in most cases, the crystal portion exists in a three-dimensional region whose one side is less than 100 nm. In an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal portions included in the CAAC-OS film, a c-axis is aligned in a direction parallel to a normal vector of a surface where the CAAC-OS film is formed or a normal vector of a surface of the CAAC-OS film, and triangular or hexagonal atomic arrangement which is seen from the direction perpendicular to the a-b plane is formed. Note that, among crystal portions, the directions of the a-axis and the b-axis of one crystal portion may be different from those of another crystal portion. In this specification, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction parallel to a normal vector of the surface where the CAAC-OS film is formed or a normal vector of the surface of the CAAC-OS film. The crystal portion is formed by film formation or by performing treatment for crystallization such as heat treatment after film formation.

With the use of the CAAC-OS film in a transistor, change in electric characteristics of the transistor due to irradiation with visible light or ultraviolet light can be reduced. Thus, the transistor has high reliability. Specifically, as described above, it is preferable that the average surface roughness (Ra) of the surface of the insulating film 233 be 1 nm or less, preferably 0.3 nm or less, further preferably 0.1 nm or less and a CAAC-OS film be formed over the surface of the insulating film 233. Thus, the crystallinity of the CAAC-OS film can be increased, and the mobility of the transistor including the CAAC-OS film can be increased.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle is attached to a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on a manufactured sputtering target.

In the case where the oxide semiconductor film 235 is the CAAC-OS film, the substrate is heated to a temperature higher than 200° C. and lower than or equal to 700° C., preferably higher than 300° C. and lower than or equal to 500° C., more preferably higher than or equal to 400° C. and lower than or equal to 450° C. during the formation of the oxide semiconductor film 235. The oxide semiconductor film 235 is formed while the substrate is heated in this manner, whereby the oxide semiconductor film 235 can be the CAAC-OS film.

Alternatively, a first oxide semiconductor film having a thickness of greater than or equal to a thickness of one atomic layer and less than or equal to 10 nm, preferably greater than or equal to 2 nm and less than or equal to 5 nm, which is thin, is formed while the heating is performed at temperature in the above range, and then a second oxide semiconductor film which is thick is formed while heating is performed in a similar manner; thus, the first oxide semiconductor film and the second oxide semiconductor film may be stacked to form the oxide semiconductor film 235 which is the CAAC-OS film.

Further, in order to make the oxide semiconductor film 235 have an amorphous structure, the substrate is not heated or the substrate is heated at a temperature lower than 200° C., preferably lower than 180° C. during the deposition of the oxide semiconductor film 235. The oxide semiconductor film 235 is formed in this manner, whereby the oxide semiconductor film 235 can have an amorphous structure.

Alternatively, the oxide semiconductor film 235 which is the CAAC-OS film may be formed in the following manner: after an oxide semiconductor film having an amorphous structure is formed in the above manner, heat treatment at a temperature of higher than or equal to 250° C. and lower than or equal to 700° C., preferably higher than or equal to 400° C., more preferably higher than or equal to 500° C., still more preferably higher than or equal to 550° C. is performed, so that at least part of the oxide semiconductor film having an amorphous structure is crystallized. Note that the heat treatment can be performed in an inert gas atmosphere. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is lower than or equal to 1 ppm, preferably lower than or equal to 0.1 ppm). Heat treatment for dehydration or dehydrogenation, which is described later, can serve as this heat treatment.

In the above method, as the substrate heating temperature at the time of film formation is higher, the impurity concentration of the obtained oxide semiconductor film 235 is lower. Further, the atomic arrangement in the oxide semiconductor film 235 is ordered and the density thereof is increased, so that a polycrystalline film or a CAAC-OS film is likely to be formed. Furthermore, by the film formation in an oxygen gas atmosphere, a polycrystalline film or a CAAC-OS film is more easily formed because an unnecessary atom of a rare gas or the like is not included. Note that a mixed gas atmosphere including an oxygen gas and a rare gas may be used. In that case, the percentage of an oxygen gas is higher than or equal to 30 vol %, preferably higher than or equal to 50 vol %, more preferably higher than or equal to 80 vol %.

After the oxide semiconductor film 235 is formed, the oxide semiconductor film 235 may be subjected to heat treatment. The heat treatment can further remove a substance including a hydrogen atom in the oxide semiconductor film 235. The heat treatment is performed in an inert gas atmosphere at a temperature of higher than or equal to 300° C. and lower than or equal to 700° C., preferably higher than or equal to 450° C. and lower than or equal to 600° C. In the case where the substrate has the strain point, the heat treatment is performed at a temperature lower than the strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is lower than or equal to 1 ppm, preferably lower than or equal to 0.1 ppm).

The heat treatment can be performed in such a way that, for example, the semiconductor substrate 201 is introduced into an electric furnace using a resistance heating element or the like and heated at 450° C. under a nitrogen atmosphere for an hour.

The heat treatment apparatus is not limited to the electric furnace and may be an apparatus for heating an object to be processed by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used. Note that in the case where a GRTA apparatus is used as the heat treatment apparatus, the substrate may be heated in an inert gas heated to a high temperature of 650° C. to 700° C. because the heat treatment time is short.

In addition, after the oxide semiconductor film 235 is heated by the heat treatment, a high-purity oxygen gas, a high-purity $N_2O$ gas, or ultra dry air (the moisture concentration is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace. It is preferable that water, hydrogen, and the like be not contained in these gases in particular. The purity of the oxygen gas or the $N_2O$ gas that is introduced into the same furnace is preferably 6N or higher, further preferably 7N or higher (i.e., the concentration of impurities in the oxygen gas or the $N_2O$ gas is 1 ppm or lower, preferably 0.1 ppm or lower). By the action of the oxygen gas or the $N_2O$ gas, oxygen which is one of main components of the oxide semiconductor and which has been eliminated at the same time as the step for removing impurities by dehydration or dehydrogenation can be supplied.

Note that the heat treatment can be referred to as dehydration treatment, dehydrogenation treatment, or the like because of its advantageous effect of removing hydrogen, water, or the like. The heat treatment can be performed at the timing, for example, before the oxide semiconductor layer is processed to have an island shape, after the gate insulating film is formed, or the like. Such heat treatment for dehydration or dehydrogenation may be performed once or plural times.

Next, part of the oxide semiconductor film 235 is selectively etched to form an island-shaped oxide semiconductor film 237. Then, an insulating film 239 is formed over the oxide semiconductor film 237 by a sputtering method, a CVD method, or the like. After that, a gate electrode 241 is formed over the insulating film 239 (see FIG. 5B).

The insulating film 239 may be formed with a single layer or a stack using one or more of silicon oxide, silicon oxynitride, silicon nitride oxide, aluminum oxide, hafnium oxide, gallium oxide, a Ga—Zn—O-based metal oxide film, and the like. Like the insulating film 233, the insulating film 239 may also be formed using an oxide insulating film from which oxygen is released by heating. By using a film from which oxygen is released by heating as the insulating film 239, oxygen vacancies caused in the oxide semiconductor film 237 can be reduced by heat treatment performed later and deterioration of electric characteristics of the transistor can be suppressed.

When the insulating film 239 is formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, gate leakage current can be decreased even when the thickness of the gate insulating film is reduced.

The thickness of the insulating film 239 is preferably greater than or equal to 10 nm and less than or equal to 300 nm, more preferably greater than or equal to 5 nm and less than or equal to 50 nm, still more preferably greater than or equal to 10 nm and less than or equal to 30 nm.

The gate electrode 241 can be formed using a metal element selected from aluminum, chromium, copper, tantalum, titanium, molybdenum, and tungsten; an alloy containing any of these metal elements as a component; an alloy containing these metal elements in combination; or the like. Further, one or both metal elements of manganese and zirconium may be used. Further, the gate electrode 241 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 241 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a stacked-layer structure formed using the above light-transmitting conductive material and the above metal element.

The gate electrode 241 is formed by a printing method or an inkjet method. Alternatively, the gate electrode 241 is formed in such a manner that a conductive film is formed by a sputtering method, a CVD method, an evaporation method, or the like and then part of the conductive film is selectively etched.

A material layer in contact with the insulating film 239, such as an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN), is preferably provided between the gate electrode 241 and the insulating film 239. These films each have a work function of higher than or equal to 5 eV, preferably higher than or equal to 5.5 eV; thus, the threshold voltage in the electric characteristics of the transistor can be positive. Accordingly, a so-called normally-off switching element can be obtained. For example, in the case of using an In—Ga—Zn—O film containing nitrogen, an In—Ga—Zn—O film having at least a higher nitrogen concentration than the oxide semiconductor film 237, specifically, an In—Ga—Zn—O film having a nitrogen concentration of higher than or equal to 7 at. % is used.

Note that after the insulating film 239 is formed, heat treatment (second heat treatment) may be performed in an inert gas atmosphere or an oxygen atmosphere. The heat treatment temperature is preferably higher than or equal to 200° C. and lower than or equal to 450° C., more preferably higher than or equal to 250° C. and lower than or equal to 350° C. By performing such heat treatment, variation in electrical characteristics of the transistor can be reduced. In the case where oxygen is contained in the insulating film 233 or the insulating film 239 which is in contact with the oxide semiconductor film 237, oxygen can be supplied to the oxide semiconductor film 237 and the oxygen vacancies in the oxide semiconductor film 237 can be repaired. As described above, the heat treatment has an effect of supplying oxygen; therefore, the heat treatment can also be referred to as supply of oxygen.

Note that here, the heat treatment for supply of oxygen is performed after the insulating film 239 is formed; however, the timing of the heat treatment for supply of oxygen is not limited thereto.

As described above, the heat treatment for dehydration or dehydrogenation and the heat treatment for supply of oxygen are performed to reduce impurities and fill oxygen vacancies in the oxide semiconductor film 237, whereby the oxide semiconductor film 237 can be highly purified so as to contain impurities other than main components of the oxide semiconductor film 237 as few as possible.

Figure 6A:
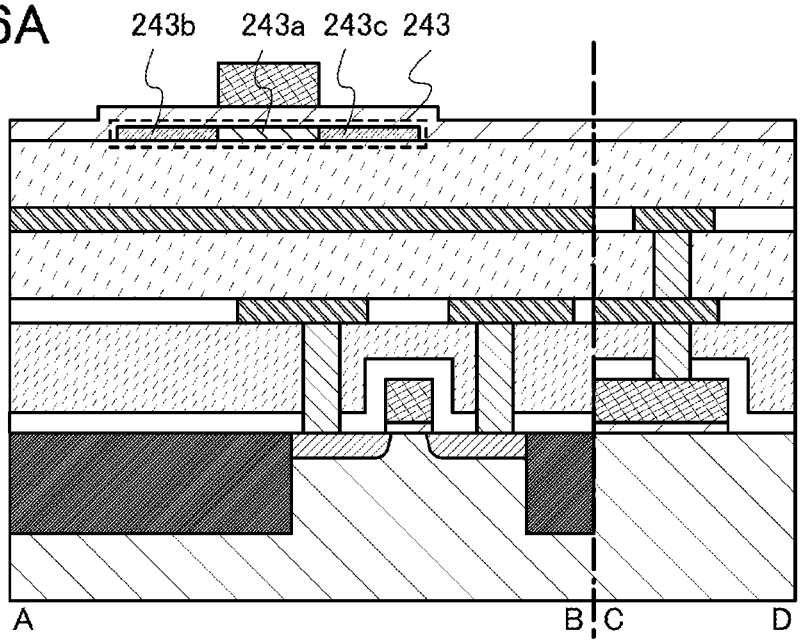
FIGS. 6A and 6B are schematic cross-sectional views illustrating a structural example of a semiconductor storage device and manufacturing steps thereof.

Next, treatment for adding a dopant to the oxide semiconductor film 237 may be performed with the use of the gate electrode 241 as a mask. As a result, as illustrated in FIG. 6A, a first region 243a which is covered with the gate electrode 241 and to which the dopant is not added and a pair of second regions 243b and 243c containing the dopant are formed. Since the dopant is added with the use of the gate electrode 241 as a mask, the first region 243a to which the dopant is not added and the pair of second regions 243b and 243c containing the dopant can be formed in a self-aligned manner. The first region 243a which overlaps with the gate electrode 241 serves as a channel region. The pair of second regions 243b and 243c containing the dopant serves as electric-field relaxation regions. Here, an oxide semiconductor film including the first region 243a and the pair of second regions 243b and 243c containing the dopant is referred to as an oxide semiconductor film 243.

The concentration of hydrogen in the first region 243a of the oxide semiconductor film 243 is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, still more preferably lower than or equal to $1\times10^{16}$ atoms/cm$^3$. By a bond of an oxide semiconductor and hydrogen, part of contained hydrogen serves as a donor to generate electrons as carriers. For that reason, by reduction in the concentration of hydrogen in the first region 243a of the oxide semiconductor film 243, a negative shift of the threshold voltage can be suppressed.

The concentration of the dopant in the pair of second regions 243b and 243c containing the dopant is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{19}$ atoms/cm$^3$.

Since the pair of second regions 243b and 243c contains the dopant, the carrier density or the number of defects can be increased. Therefore, the conductivity can be higher than that of the first region 243a which does not contain the dopant. Note that an excessive increase in the concentration of the dopant causes inhibition of carrier movement by the dopant, which leads to a reduction in conductivity of the pair of second regions 243b and 243c containing the dopant.

The pair of second regions 243b and 243c containing the dopant preferably has a conductivity of higher than or equal to 0.1 S/cm and lower than or equal to 1000 S/cm, preferably higher than or equal to 10 S/cm and lower than or equal to 1000 S/cm.

The existence of the pair of second regions 243b and 243c containing the dopant in the oxide semiconductor film 243 can relieve an electric field applied to the end portion of the first region 243a serving as a channel region. Thus, a short-channel effect of the transistor can be suppressed.

As a method for adding the dopant to the oxide semiconductor film 237, an ion doping method or an ion implantation method can be used. As the dopant, at least one of boron, nitrogen, phosphorus, and arsenic can be added. Alternatively, as the dopant, at least one of helium, neon, argon, krypton, and xenon can be added. Further alternatively, hydrogen may be added as the dopant. Still alternatively, as the dopant, at least one of boron, nitrogen, phosphorus, and arsenic and at least one of helium, neon, argon, krypton, and xenon in appropriate combination with hydrogen can be added.

In FIG. 6A, the oxide semiconductor film 243 is formed in such a manner that the dopant is added to the oxide semiconductor film 237 through the insulating film 239; however, the oxide semiconductor film 243 may be formed in such a manner that the dopant is added to the oxide semiconductor film 237 without the insulating film 239 over the oxide semiconductor film 237 (in a state where the oxide semiconductor film 237 is exposed).

Alternatively, the dopant can be added by a method other than an ion doping method, an ion implantation method, or the like. For example, the dopant can be added in the following manner: plasma is generated in an atmosphere of a gas containing an element to be added and plasma treatment is performed on an object to which the dopant is added. A dry etching apparatus, a CVD apparatus, a high-density CVD apparatus, or the like can be used to generate the plasma.

After that, heat treatment may be performed. The heat treatment is performed typically at a temperature of higher than or equal to 150° C. and lower than or equal to 450° C., preferably higher than or equal to 250° C. and lower than or equal to 325° C. In the heat treatment, the temperature may be gradually increased from 250° C. to 325° C.

Through the heat treatment, the resistance of the pair of second regions 243b and 243c containing the dopant can be reduced. In the heat treatment, the pair of second regions 243b and 243c containing the dopant may be in either a crystalline state or an amorphous state.

Figure 6B:
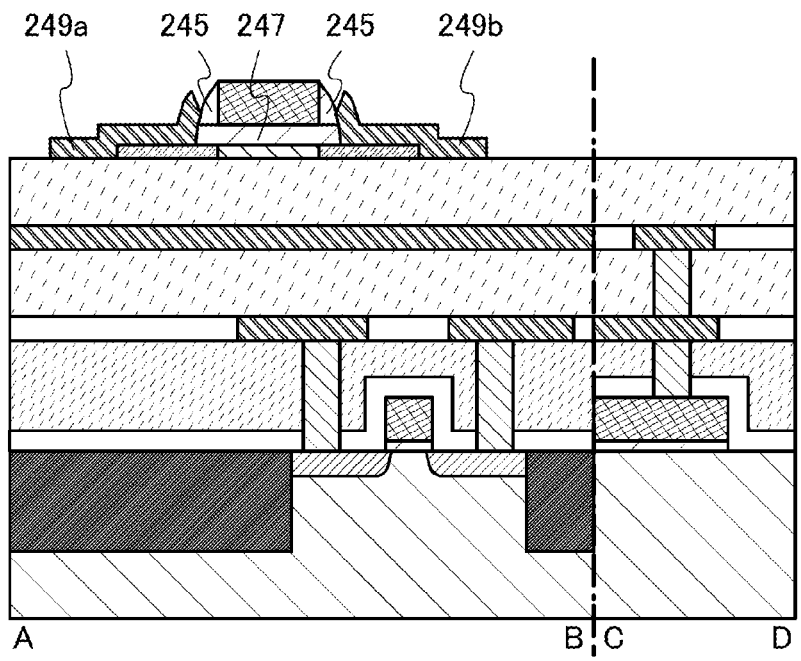

Next, as illustrated in FIG. 6B, sidewall insulating films 245 on side surfaces of the gate electrode 241, a gate insulating film 247, an electrode 249a, and an electrode 249b are formed.

The sidewall insulating films 245 may each be formed with a single layer or a stack using one or more of silicon oxide, silicon oxynitride, silicon nitride oxide, silicon nitride, aluminum oxide, aluminum oxynitride, aluminum nitride oxide, aluminum nitride, and the like, for example. The sidewall insulating films 245 may be formed using an oxide insulating film from which part of oxygen is released by heating in a manner similar to that of the insulating film 233.

A method for forming the sidewall insulating films 245 is described below.

First, an insulating film to be the sidewall insulating films 245 is formed over the insulating film 239 and the gate electrode 241. The insulating film is formed by a sputtering method, a CVD method, or the like. In addition, although the thickness of the insulating film is not particularly limited, the thickness is determined as appropriate in consideration of coverage with respect to the shape of the gate electrode 241.

Then, the sidewall insulating films 245 are formed by etching the insulating film. The etching here is highly anisotropic etching, and the sidewall insulating films 245 can be formed in a self-aligned manner by performing the highly anisotropic etching on the insulating film.

The width of the electric-field relaxation region in each of the pair of second regions 243b and 243c containing the dopant depends on the width of the sidewall insulating films 245, and the width of the sidewall insulating films 245 depends on the thickness of the gate electrode 241. Therefore, the thickness of the gate electrode 241 may be determined so that the width of the electric-field relaxation region has a desired value.

When the sidewall insulating films 245 are formed, the insulating film 239 is also etched by highly anisotropic etching and the oxide semiconductor film 243 is partly exposed, whereby the gate insulating film 247 is formed.

The pair of electrodes 249a and 249b can be formed using a material similar to the material of the wirings 223a to 223c or the material of the conductive film 229a and the wiring 229b, as appropriate. Note that the pair of electrodes 249a and 249b may function as wirings.

The pair of electrodes 249a and 249b is formed by a printing method or an inkjet method. Alternatively, the pair of electrodes 249a and 249b may be formed in such a manner that a conductive film is formed by a sputtering method, a CVD method, an evaporation method, or the like and then part of the conductive film is selectively etched.

The pair of electrodes 249a and 249b is preferably formed to be in contact with side surfaces of the sidewall insulating films 245 and the gate insulating film 247. In other words, it is preferable that end portions of the pair of electrodes 249a and 249b of the transistor be located over the sidewall insulating films 245 and that the pair of electrodes 249a and 249b entirely cover exposed portions of the pair of second regions 243b and 243c containing the dopant in the oxide semiconductor film 243. As a result, regions in the pair of second regions 243b and 243c containing the dopant, which are in contact with the pair of electrodes 249a and 249b, serve as a source region and a drain region, whereas regions in the pair of second regions 243b and 243c containing the dopant, which overlap with both the gate insulating film 247 and one of the sidewall insulating films 245, serve as electric-field relaxation regions. In addition, since the width of the electric-field relaxation regions can be controlled with the length of the sidewall insulating films 245, a high accuracy in alignment of a mask for forming the pair of electrodes 249a and 249b is not strictly required. Accordingly, variation among plural transistors can be reduced.

Note that here, the sidewall insulating films 245 are provided in contact with the side surfaces of the gate electrode 241; however, the present invention is not limited to this structure, and the sidewall insulating films 245 are not necessarily provided. Here, although the sidewall insulating films 245 are formed after the pair of second regions 243b and 243c is formed, the present invention is not limited to this structure and the pair of second regions 243b and 243c may be formed after the sidewall insulating films 245 are formed. With such a structure, the first region 243a can be extended to overlap with the sidewall insulating films 245.

Figure 7A:
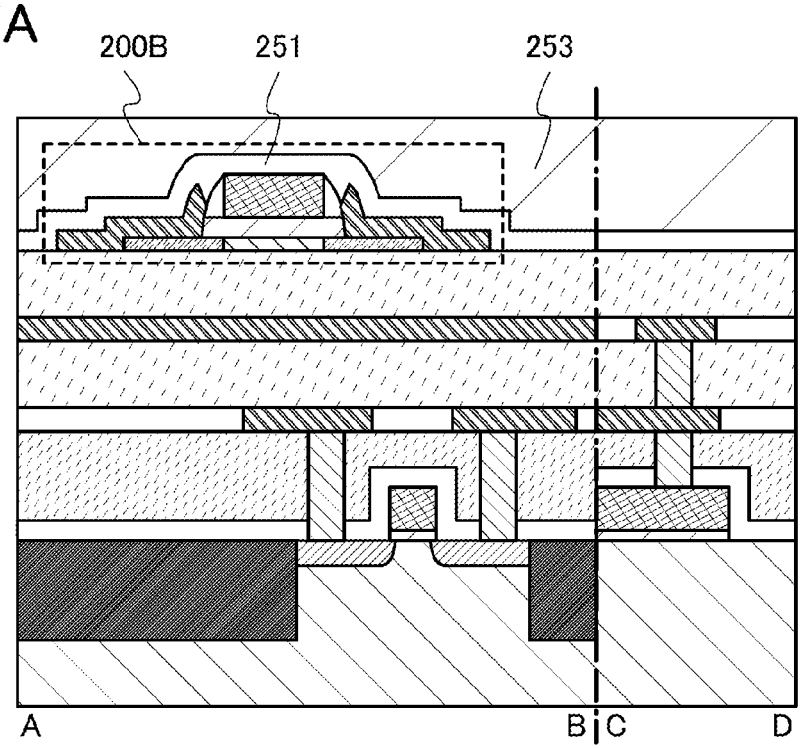
FIGS. 7A and 7B are schematic cross-sectional views illustrating a structural example of a semiconductor storage device and manufacturing steps thereof.
Figure 7B:
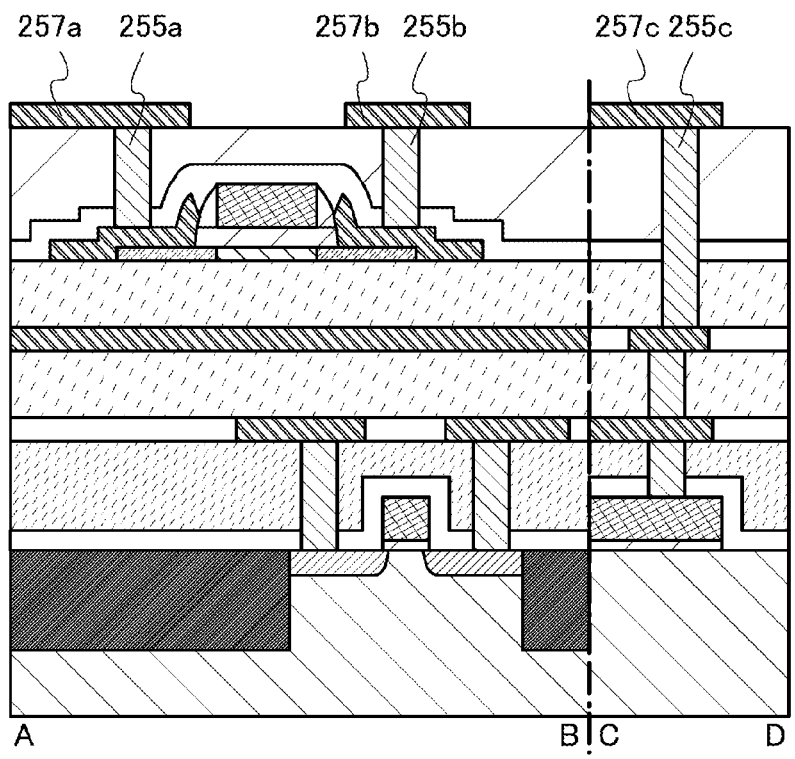

Next, as illustrated in FIG. 7A, an insulating film 251 and an insulating film 253 are formed by a sputtering method, a CVD method, a coating method, a printing method, or the like.

The insulating films 251 and 253 may each be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. When the insulating film 253 is formed using an insulating film which prevents diffusion of oxygen to the outside, oxygen released from the insulating film 251 can be supplied to the oxide semiconductor film. Typical examples of the insulating film which prevents diffusion of oxygen to the outside include films of aluminum oxide, aluminum oxynitride, and the like. When an insulating film which prevents diffusion of hydrogen from the outside is used as the insulating film 253, diffusion of hydrogen from the outside to the oxide semiconductor film can be reduced, and vacancies in the oxide semiconductor film can be reduced. Typical examples of the insulating film which prevents diffusion of hydrogen from the outside include films of silicon nitride, silicon nitride oxide, aluminum nitride, aluminum nitride oxide, and the like. Further, when the insulating film 251 has a three-layer structure of an oxide insulating film from which part of oxygen is released by heating, an insulating film which prevents diffusion of oxygen to the outside, and an oxide insulating film, oxygen can be efficiently diffused to the oxide semiconductor film and oxygen can be prevented from being released to the outside; accordingly, variation in transistor characteristics can be reduced even at high temperature and in high humidity.

Through the above steps, a transistor 200B including an oxide semiconductor can be manufactured as illustrated in FIG. 7A. Note that the transistor 200B includes the oxide semiconductor film 243 including the first region 243a which is i-type (intrinsic) or substantially i-type, and therefore exhibits excellent characteristics.

Although the transistor 200B here has a top-gate structure, the present invention is not limited to the top-gate structure and a bottom-gate structure may be employed. Further, here, in the transistor 200B, the pair of electrodes 249a and 249b is in contact with at least part of upper surfaces of the pair of second regions 243b and 243c; however, the present invention is not limited to this structure, and the pair of second regions 243b and 243c may be in contact with at least part of the pair of electrodes 249a and 249b, for example. An impurity region is not necessarily formed in the oxide semiconductor film 237.

Next, part of each of the insulating film 233, the insulating film 251, and the insulating film 253 is selectively etched to form an opening portion, so that part of each of the wiring 223c, the electrode 249a, and the electrode 249b is exposed. Then, a contact plug 255a, a contact plug 255b, and a contact plug 255c are formed. Note that the contact plugs 255a to 255c can be formed using a method and a material similar to those of the contact plugs 219a to 219c or the contact plug 227, as appropriate.

Next, a conductive film is formed over the insulating film 253 and the contact plugs 255a to 255c by a sputtering method, a CVD method, or the like and then an unnecessary portion of the conductive film is removed by etching. Thus, a wiring 257a, a wiring 257b, and a wiring 257c are formed (see FIG. 7B).

Note that the wirings 257a to 257c can be formed using a material similar to the material of the wirings 223a to 223c or the material of the conductive film 229a and the wiring 229b.

Through the above steps, the transistor 200A (the transistor formed using a semiconductor substrate) included in the peripheral circuit 100 illustrated in FIG. 1, the conductive film 229a serving as the shielding layer 20 illustrated in FIG. 1, the transistor 200B (the transistor formed using an oxide semiconductor material) included in the memory cell array 30 illustrated in FIG. 1, and the wirings (the wiring 209b, the contact plug 219c, the wiring 223c, the contact plug 227, the wiring 229b, the contact plug 255c, and the wiring 257c) for electrically connecting the peripheral circuit 100 and the memory cell array 30 illustrated in FIG. 1 can be manufactured.

<Semiconductor Storage Device Disclosed in this Specification>

High integration of the semiconductor storage device disclosed in this specification can be achieved by stacking the memory cell array 30 and the peripheral circuit 100. Further, the semiconductor storage device disclosed in this specification includes the shielding layer 20 between the memory cell array 30 and the peripheral circuit 100. With this structure, the memory cell array 30 and the peripheral circuit 100 can be shielded from radiation noise generated between the memory cell array 30 and the peripheral circuit 100. Accordingly, probability of malfunction of the semiconductor storage device can be reduced. It is particularly preferable that the shielding layer 20 be provided between the memory cell array 30 and the peripheral circuit 100 in the case where the semiconductor storage device disclosed in this specification is a DRAM, since as described above, probability that malfunction due to radiation noise occurs is high at the time of data reading in a DRAM in which a memory cell array and a peripheral circuit are stacked.

Modification Examples

The semiconductor storage device described above is an embodiment of the present invention, and a semiconductor storage device having a structure different from the structure of the semiconductor storage device described above is also included in the present invention.

Figure 8:
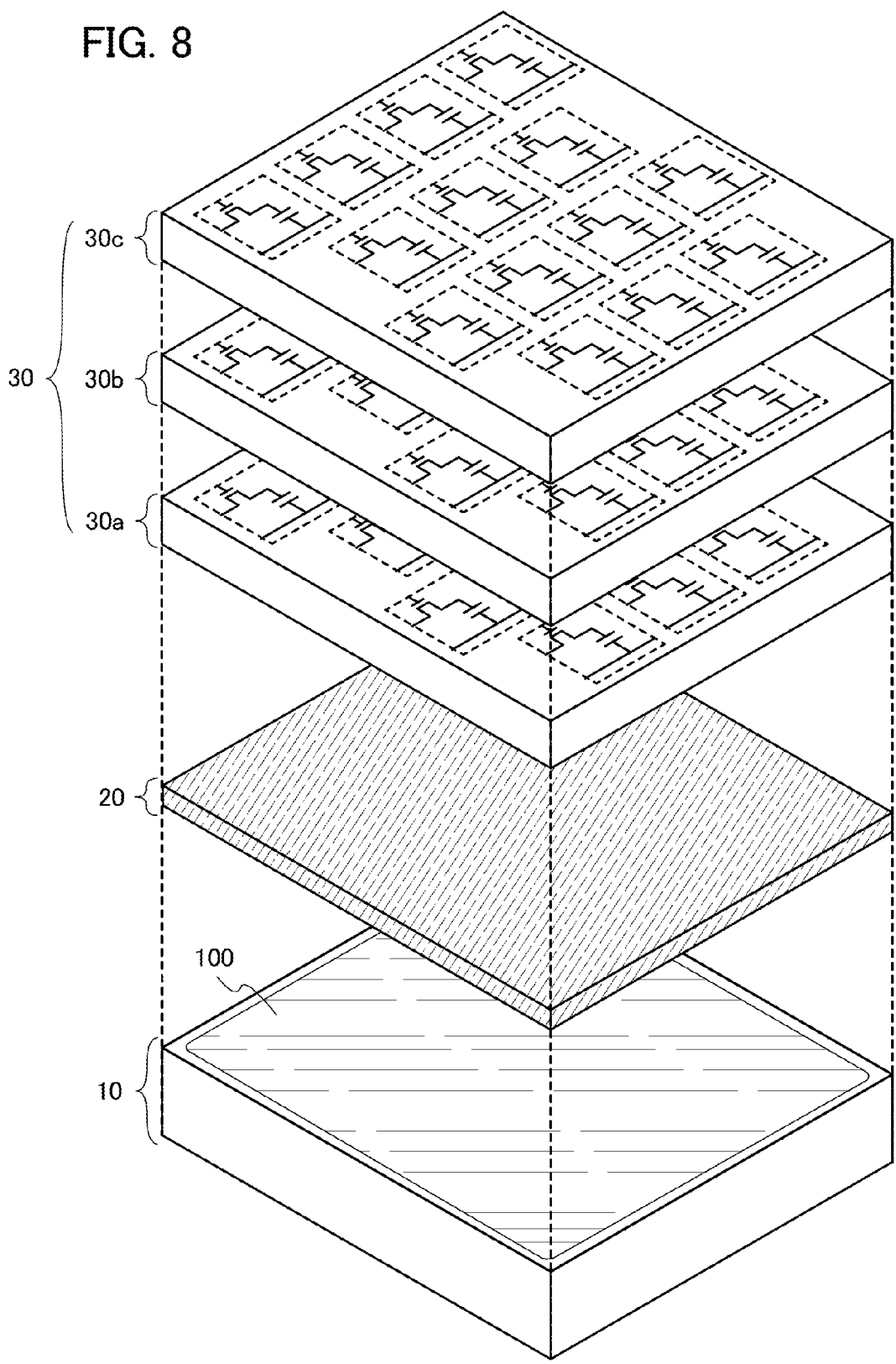
FIG. 8 illustrates a structural example of a semiconductor storage device.

For example, FIG. 1 illustrates an example in which the memory cell array 30 includes one layer. A structure in which the memory cell array 30 includes a plurality of divided memory cell arrays is possible. Specifically, as illustrated in FIG. 8, the memory cell array 30 may include a divided memory cell array layer 30a, a divided memory cell array layer 30b, and a divided memory cell array layer 30c which are stacked and each of which includes a plurality of memory cells. Thus, a further increase in the degree of integration of the semiconductor storage device can be achieved.

Figure 9:
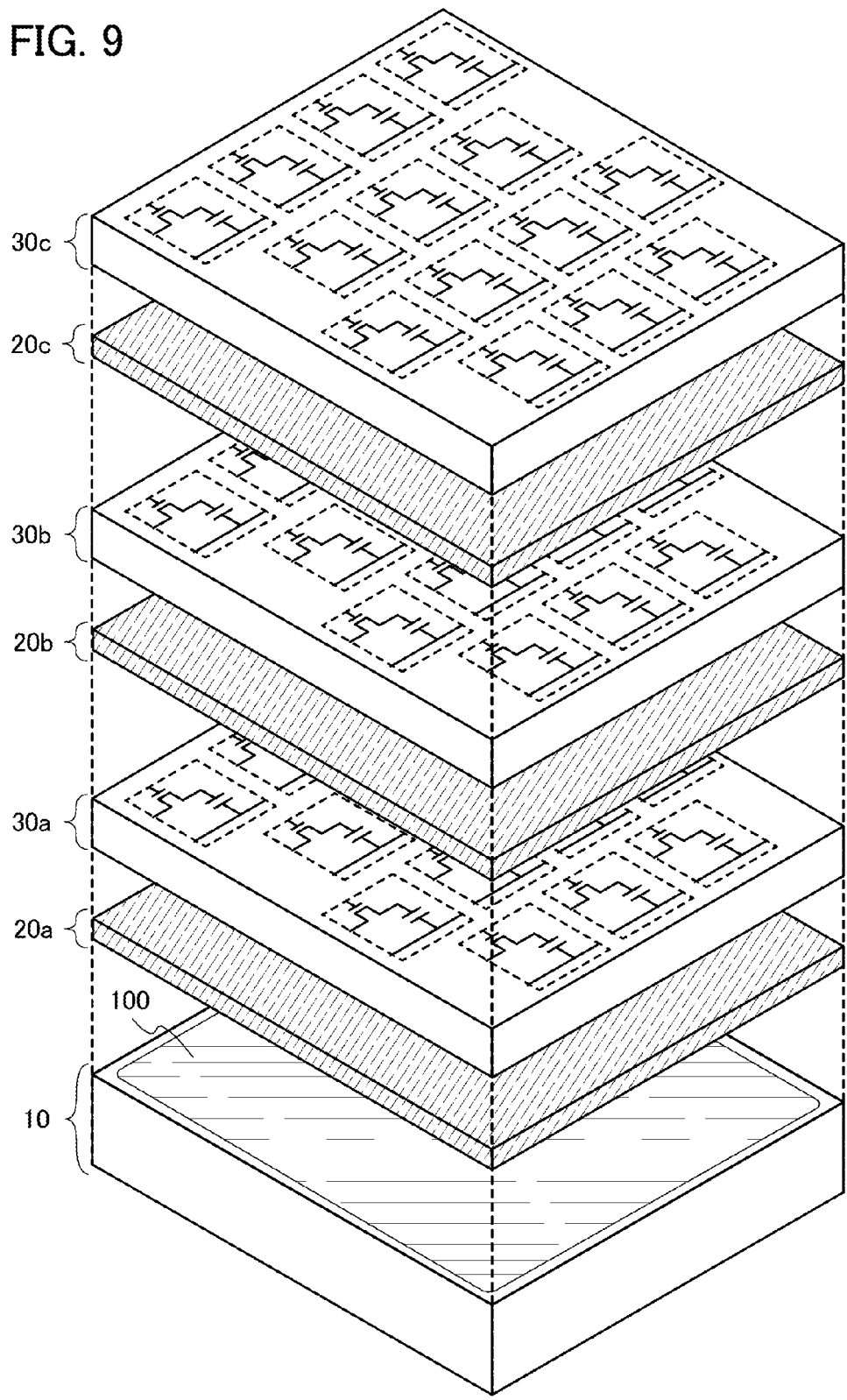
FIG. 9 illustrates a structural example of a semiconductor storage device.

Further, in the semiconductor storage device illustrated in FIG. 8, a shielding layer may be provided between any two adjacent divided memory cell array layers of the plurality of divided memory cell array layers. Specifically, as illustrated in FIG. 9, a structure is possible in which a shielding layer 20a is provided between the peripheral circuit 100 and the divided memory cell array layer 30a, a shielding layer 20b is provided between the divided memory cell array layer 30a and the divided memory cell array layer 30b, and a shielding layer 20c is provided between the divided memory cell array layer 30b and the divided memory cell array layer 30c. With this structure, high integration of the semiconductor storage device and prevention of malfunction of the semiconductor storage device can be achieved.

Note that in any of the semiconductor storage devices disclosed in this specification, the structure of wirings for electrically connecting the peripheral circuit 100 and the memory cell array 30 is not limited to the structure illustrated in FIGS. 3A to 3D, FIGS. 4A to 4C, FIGS. 5A and 5B, FIGS. 6A and 6B, and FIGS. 7A and 7B.

Figure 10A:
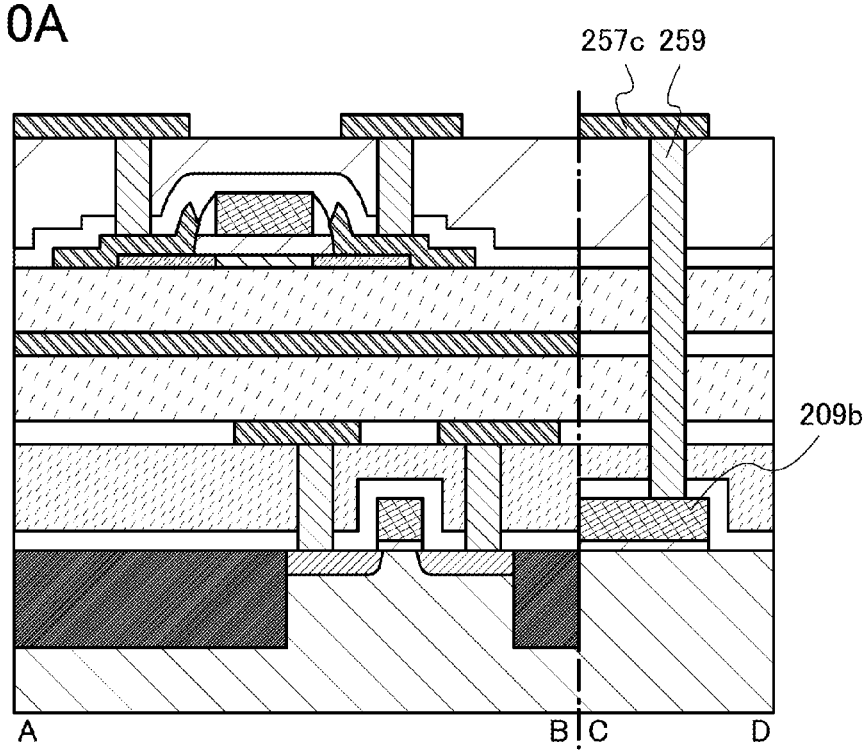
FIGS. 10A and 10B are schematic cross-sectional views each illustrating a structural example of a semiconductor storage device.

For example, as illustrated in FIG. 10A, the peripheral circuit 100 and the memory cell array 30 can be electrically connected to each other through a contact plug 259 which penetrates all the insulating films provided between the wiring 209b and the wiring 257c.

Figure 10B:
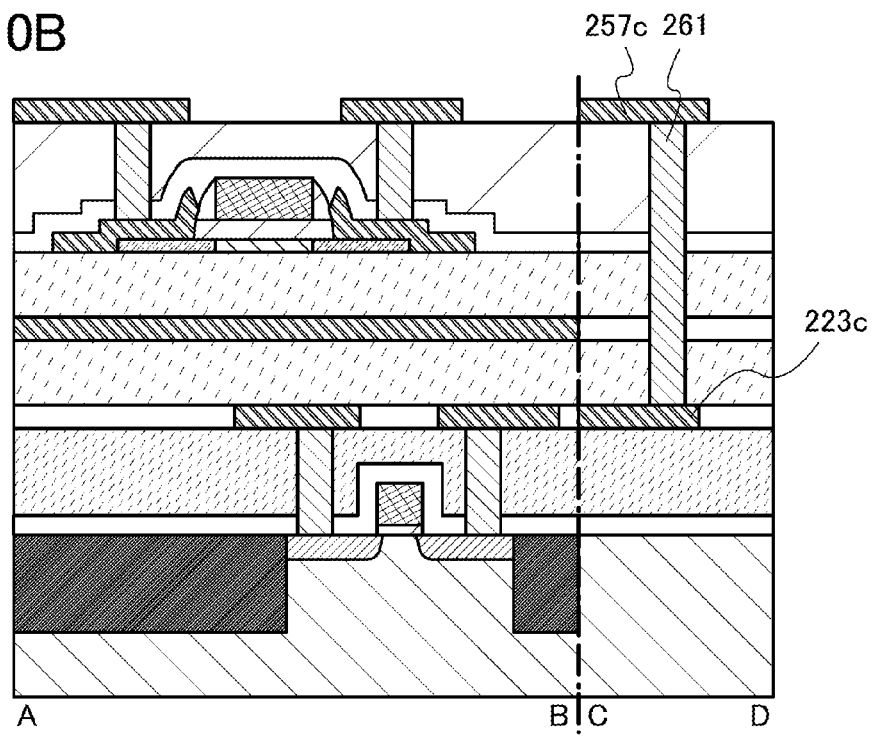

Alternatively, as illustrated in FIG. 10B, the peripheral circuit 100 and the memory cell array 30 can be electrically connected to each other through a contact plug 261 which penetrates all the insulating films provided between the wiring 257c and the wiring 223c in the same layer as a source electrode and a drain electrode of the transistor formed using a semiconductor substrate.

Thus, the peripheral circuit 100 and the memory cell array 30 can be electrically connected in a variety of manners; therefore, the connection method of the peripheral circuit 100 and the memory cell array 30 can be determined as appropriate in accordance with a design condition, a manufacture condition, or the like. Note that a preferable example is the structure in which, as illustrated in FIGS. 3A to 3D, FIGS. 4A to 4C, FIGS. 5A and 5B, FIGS. 6A and 6B, and FIGS. 7A and 7B, the wiring 229b in the same layer as the conductive film 229a serving as the shielding layer 20 constitutes part of the wiring for electrically connecting the peripheral circuit 100 and the memory cell array 30. This is because, with such a structure, probability of occurrence of contact failure can be reduced as compared to the structures illustrated in FIGS. 10A and 10B in the case where a process pattern is displaced due to mask misalignment or the like in the manufacturing process.

Further, the structure of the insulating films between the peripheral circuit 100 and the shielding layer 20 or the insulating films between the shielding layer 20 and the memory cell array 30 in the semiconductor storage device disclosed in this specification is not limited to the structure illustrated in FIGS. 3A to 3D, FIGS. 4A to 4C, FIGS. 5A and 5B, FIGS. 6A and 6B, and FIGS. 7A and 7B.

Figure 11A:
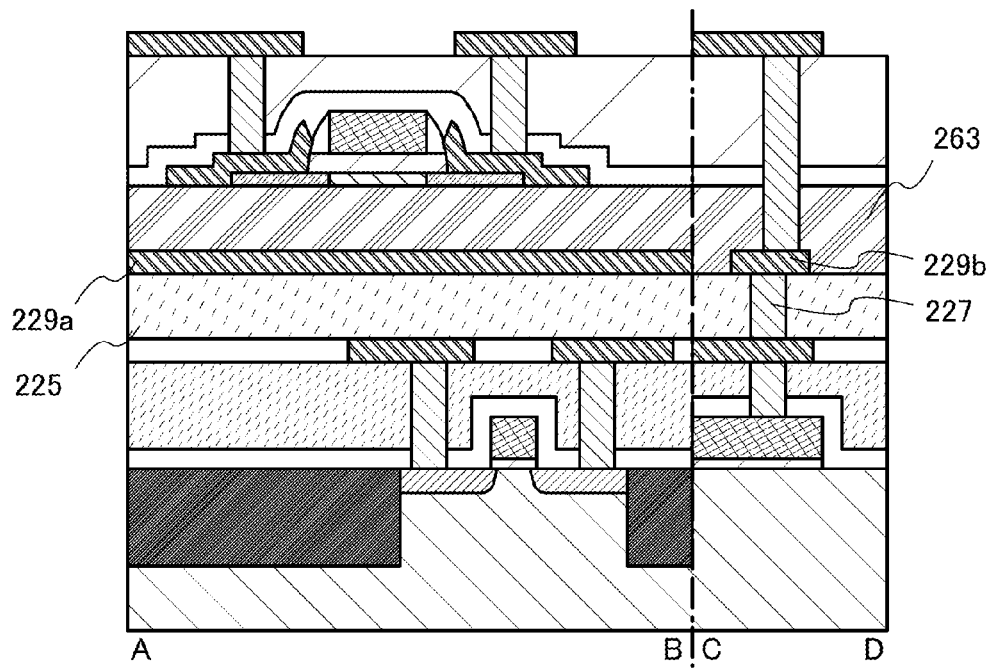
FIGS. 11A and 11B are schematic cross-sectional views each illustrating a structural example of a semiconductor storage device.

For example, as illustrated in FIG. 11A, an insulating film between the conductive film 229a serving as the shielding layer 20 and the wiring 229b serving as part of the wiring for electrically connecting the peripheral circuit 100 and the memory cell array 30 and an insulating film between the conductive film 229a and the memory cell array 30 can be formed with one continuous insulating film. Specifically, a conductive film is formed over the insulating film 225 and the contact plug 227 by a sputtering method, a CVD method, or the like, and then part of the conductive film is selectively etched; thus, the conductive film 229a and the wiring 229b are formed. Then, an insulating film 263 is formed over the conductive film 229a, the wiring 229b, and the insulating film 225 by a sputtering method, a CVD method, or the like.

Figure 11B:
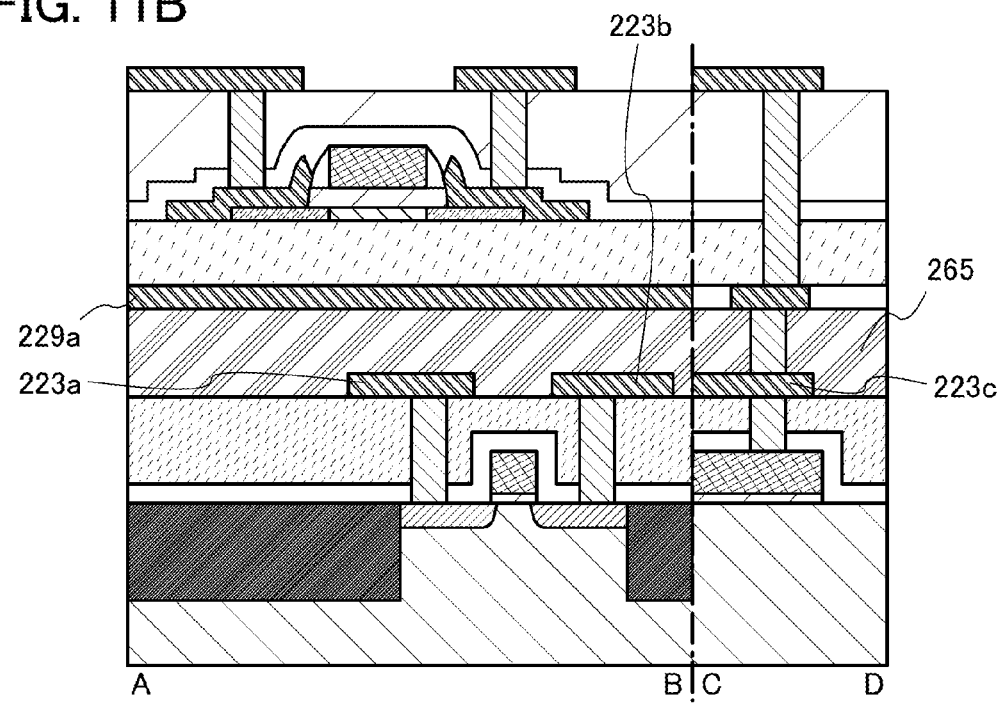

Alternatively, as illustrated in FIG. 11B, an insulating film between the peripheral circuit 100 and the conductive film 229a, an insulating film between the wirings (the wirings 223a and 223b) of the peripheral circuit 100, and an insulating film between the wiring of the peripheral circuit 100 and the wiring 223c serving as part of the wiring for electrically connecting the peripheral circuit 100 and the memory cell array 30 can be formed with one continuous insulating film 265.

Further alternatively, a structure in which the insulating film 265 is provided between the peripheral circuit 100 and the shielding layer 20 and the insulating film 263 is provided between the shielding layer 20 and the memory cell array 30 may be employed (not illustrated).

In the semiconductor storage device disclosed in this specification, the shielding layer 20 can have another function in addition to the function of shielding the peripheral circuit 100 and the memory cell array 30 from radiation noise generated between the peripheral circuit 100 and the memory cell array 30. For example, in the case where the memory cell array 30 includes the memory cells 300 illustrated in FIG. 1, part of the shielding layer 20 can function as one of a pair of electrodes of the capacitor 302 (as an electrode supplied with a fixed potential).

Figure 12A:
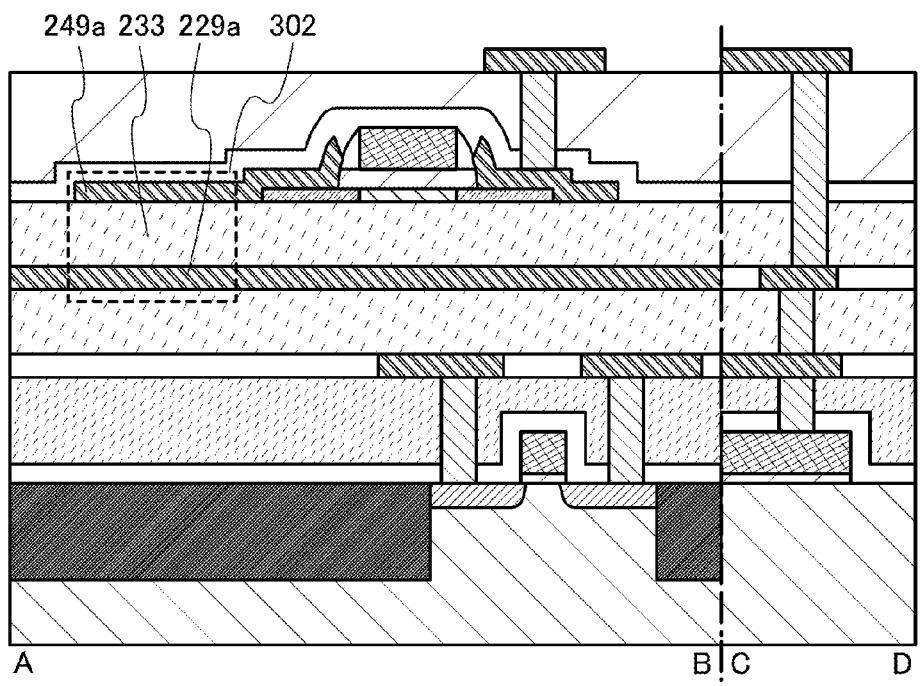
FIGS. 12A and 12B are schematic cross-sectional views each illustrating a structural example of a semiconductor storage device.
Figure 12B:
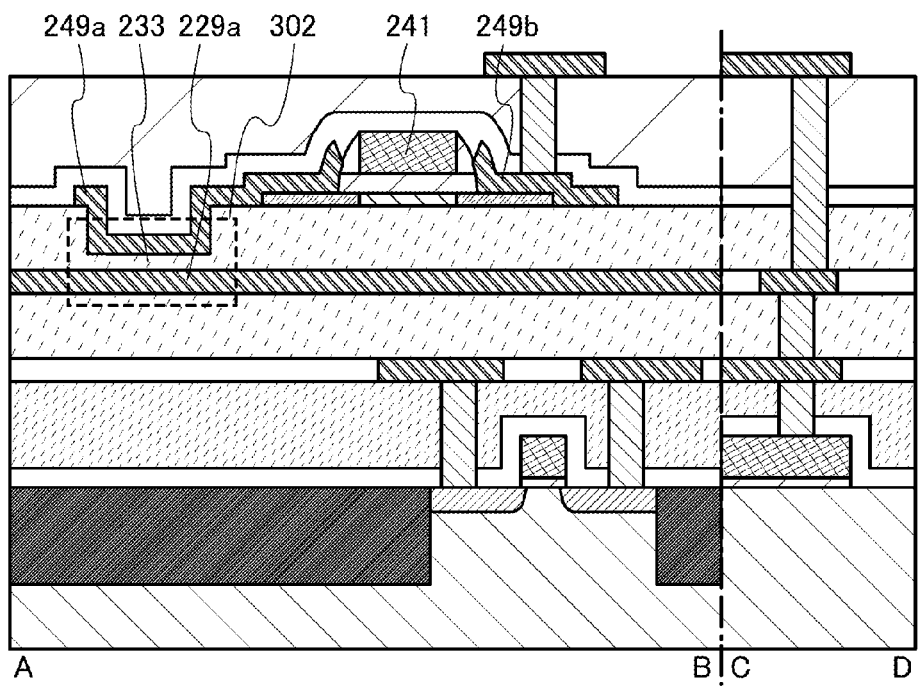

Specifically, as illustrated in FIG. 12A, the electrode 249a serving as a source or a drain of the transistor, the insulating film 233, and the conductive film 229a serving as the shielding layer 20 can be included in the capacitor 302. Further, the thickness of a region of the insulating film 233, where the capacitor 302 is formed, is preferably smaller than that of the other region. In other words, it is preferable that the distance between the electrode 249a and the conductive film 229a be shorter than the distance between the wiring 229b and any other electrodes and wirings (e.g., the gate electrode 241 and the electrode 249b) in the memory cell array 30. For example, as illustrated in FIG. 12B, a depressed portion may be formed in the insulating film 233 and the capacitor 302 may be formed in the depressed portion. Thus, an increase in storage capacitance per unit area of the capacitor 302 and high integration of the memory cell array 30 can be achieved.

Figure 13:
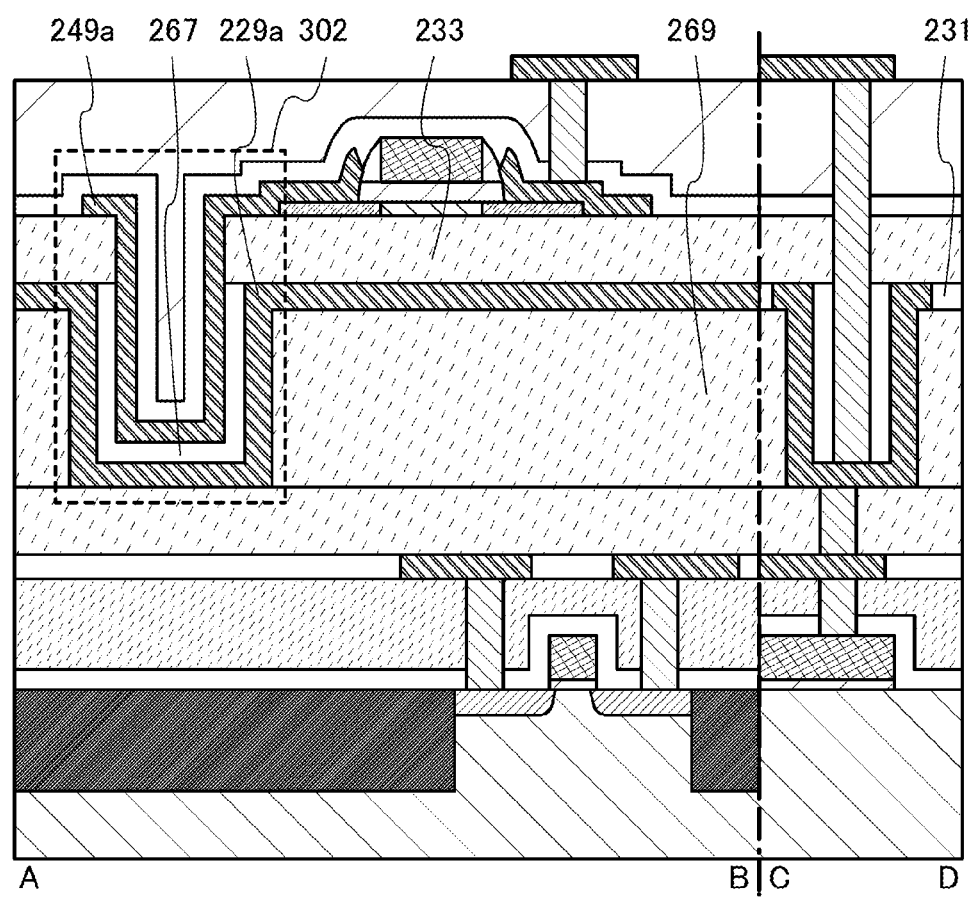
FIG. 13 is a schematic cross-sectional view illustrating a structural example of a semiconductor storage device.

Further, as illustrated in FIG. 13, the capacitor 302 can be a trench capacitor. Specifically, the capacitor 302 can be formed using the electrode 249a, an insulating film 267, and the conductive film 229a in a depressed portion or an opening portion provided in the insulating film 269. With the structure illustrated in FIG. 13, an increase in storage capacitance per unit area of the capacitor 302 and high integration of the memory cell array 30 can be achieved. Note that the insulating film 267 can be formed in a manner similar to that of the insulating film 231. Further, when the semiconductor storage device illustrated in FIG. 13 is manufactured, it is necessary to form the insulating film 269 having the depressed portion or the opening portion before formation of the conductive film 229a, to form an opening portion in the insulating film 233 before formation of the electrode 249a, and the like. The insulating film 269 can be formed using a material similar to that of the insulating film 225.

Note that a plurality of structures described as the modification examples can be applied to the semiconductor storage device described with reference to FIG. 1, FIGS. 2A and 2B, FIGS. 3A to 3D, FIGS. 4A to 4C, FIGS. 5A and 5B, FIGS. 6A and 6B, and FIGS. 7A and 7B.

This application is based on Japanese Patent Application serial no. 2011-205581 filed with Japan Patent Office on Sep.

21, 2011, and Japanese Patent Application serial no. 2011-225514 filed with Japan Patent Office on Oct. 13, 2011, the entire contents of which are hereby incorporated by reference.

What is claimed is:

1. A semiconductor storage device comprising:
    a peripheral circuit;
    a conductive film over the peripheral circuit; and
    a memory cell array over the conductive film,
    wherein the memory cell array comprises a memory cell comprising a transistor, and
    wherein entirety of the memory cell array overlaps with the conductive film.

2. The semiconductor storage device according to claim 1, wherein an active layer of the transistor comprises an oxide semiconductor material.

3. The semiconductor storage device according to claim 1, wherein the peripheral circuit is formed by utilizing a semiconductor substrate.

4. The semiconductor storage device according to claim 1, further comprising a second conductive film over the memory cell array and a second memory cell array over the second conductive film.

5. The semiconductor storage device according to claim 1, wherein the conductive film is configured to be supplied with a ground potential.

6. The semiconductor storage device according to claim 5, wherein the peripheral circuit is electrically connected to the memory cell array through a contact plug comprising a same layer as the conductive film.

7. A semiconductor storage device comprising:
    a peripheral circuit;
    a shielding layer over the peripheral circuit; and
    a memory cell array over the shielding layer,
    wherein the memory cell array comprises a memory cell comprising a transistor,
    wherein the shielding layer is configured to shield the peripheral circuit and the memory cell array from radiation noise generated between the peripheral circuit and the memory cell array, and
    wherein the shielding layer is configured to be supplied with a ground potential.

8. The semiconductor storage device according to claim 7, wherein an active layer of the transistor comprises an oxide semiconductor material.

9. The semiconductor storage device according to claim 7, wherein the peripheral circuit is formed by utilizing a semiconductor substrate.

10. The semiconductor storage device according to claim 7, further comprising a second shielding layer over the memory cell array and a second memory cell array over the second shielding layer.

11. The semiconductor storage device according to claim 7, wherein entirety of the memory cell array overlaps with the shielding layer.

12. The semiconductor storage device according to claim 7, wherein the peripheral circuit is electrically connected to the memory cell array through a contact plug comprising a same layer as the shielding layer.

13. A semiconductor storage device comprising:
    a peripheral circuit;
    a first insulating film over the peripheral circuit;
    a conductive film over the first insulating film;
    a second insulating film over the conductive film; and
    a memory cell array over the second insulating film,
    wherein the memory cell array comprises a memory cell comprising a transistor electrically connected to an electrode,
    wherein a capacitor is formed using a region of the conductive film as a first electrode, a region of the second insulating film over the region of the conductive film, and a region of the electrode over the region of the second insulating film as a second electrode, and
    wherein entirety of the memory cell array overlaps with the conductive film.

14. The semiconductor storage device according to claim 13, wherein an active layer of the transistor comprises an oxide semiconductor material.

15. The semiconductor storage device according to claim 13, wherein the peripheral circuit is formed by utilizing a semiconductor substrate.

16. The semiconductor storage device according to claim 13, further comprising a second conductive film over the memory cell array and a second memory cell array over the second conductive film.

17. The semiconductor storage device according to claim 13, wherein the conductive film is configured to be supplied with a ground potential.

18. The semiconductor storage device according to claim 17, wherein the peripheral circuit is electrically connected to the memory cell array through a contact plug comprising a same layer as the conductive film.

19. The semiconductor storage device according to claim 13, wherein a distance between the region of the electrode and the region of the conductive film is shorter than a distance between at least one of a source and a drain of the transistor and the conductive film.

20. The semiconductor storage device according to claim 13, wherein the capacitor is a trench capacitor formed in a depressed portion or an opening portion provided in the first insulating film.

* * * * *